(12) United States Patent
Choi et al.

(10) Patent No.: US 11,152,955 B2
(45) Date of Patent: Oct. 19, 2021

(54) METHOD AND APPARATUS FOR FAST DECODING LINEAR CODE BASED ON SOFT DECISION

(71) Applicant: Industry-University Cooperation Foundation Hanyang University, Seoul (KR)

(72) Inventors: Chang Ryoul Choi, Seoul (KR); Je Chang Jeong, Seoul (KR)

(73) Assignee: Industry-University Cooperation Foundation Hanyang University, Seoul (KR)

(*) Notice: Subject to any disclaimer, the term of this patent is extended or adjusted under 35 U.S.C. 154(b) by 23 days.

(21) Appl. No.: 16/651,005

(22) PCT Filed: Apr. 19, 2019

(86) PCT No.: PCT/KR2019/004753
§ 371 (c)(1),
(2) Date: Mar. 26, 2020

(87) PCT Pub. No.: WO2020/179966
PCT Pub. Date: Sep. 10, 2020

(65) Prior Publication Data
US 2021/0242883 A1    Aug. 5, 2021

(30) Foreign Application Priority Data
Mar. 7, 2019  (KR) .................. 10-2019-0026387

(51) Int. Cl.
*H03M 13/00*  (2006.01)
*H03M 13/11*  (2006.01)
*H03M 13/15*  (2006.01)

(52) U.S. Cl.
CPC .... *H03M 13/1111* (2013.01); *H03M 13/1108* (2013.01); *H03M 13/611* (2013.01); *H03M 13/1575* (2013.01)

(58) Field of Classification Search
CPC .......... H03M 13/1111; H03M 13/1108; H03M 13/611; H03M 13/1575
See application file for complete search history.

(56) References Cited

U.S. PATENT DOCUMENTS 6,381,726 B1    4/2002  Weng
7,260,762 B2 *  8/2007  Desai .................. H03M 13/453
                                                      714/755

(Continued)

OTHER PUBLICATIONS

Marc P. C. Fossorier et al., "Soft-Decision Decoding of Linear Block Codes Based on Ordered Statistics", IEEE Transactions on Information Theory, Sep. 1995, pp. 1379-1396, vol. 41, No. 5.

*Primary Examiner* — Esaw T Abraham
(74) *Attorney, Agent, or Firm* — Sughrue Mion, PLLC

(57) ABSTRACT

Disclosed are a method and an apparatus for fast decoding a linear code based on soft decision. The method may comprise sorting received signals in a magnitude order to obtain sorted signals; obtaining hard decision signals by performing hard decision on the sorted signals; obtaining upper signals corresponding to MRBs from the hard decision signals; obtaining a permuted and corrected codeword candidate using the upper signals and an error vector according to a current order; calculating a cost for the current order using a cost function; determining the permuted and corrected codeword candidate as a permuted and corrected codeword according to a result of comparing the calculated cost with a minimum cost; and determining a predefined speeding condition.

20 Claims, 32 Drawing Sheets

(56) References Cited

U.S. PATENT DOCUMENTS

| | | | |
|---|---|---|---|
| 7,453,960 B1* | 11/2008 | Wu | H03M 13/1105 |
| | | | 375/340 |
| 7,720,181 B2* | 5/2010 | Park | H04L 27/2647 |
| | | | 375/341 |
| 8,108,759 B2* | 1/2012 | Moon | H03M 13/15 |
| | | | 714/781 |
| 8,352,840 B2* | 1/2013 | Crozier | H03M 13/296 |
| | | | 714/780 |
| 8,792,594 B2* | 7/2014 | Vojcic | H03M 13/27 |
| | | | 375/340 |
| 9,240,808 B2* | 1/2016 | Fonseka | H03M 13/256 |
| 9,564,927 B2* | 2/2017 | Fonseka | H03M 13/2906 |
| 10,312,946 B2* | 6/2019 | Wang | H03M 13/3784 |
| 10,404,280 B2* | 9/2019 | Lin | H03M 13/2906 |

* cited by examiner (127,64) BCH Codes, order-1

(127,64) BCH Codes, order-2

(127,64) BCH Codes, order-2

(127,64) BCH Codes, order-3

(127,64) BCH Codes, order-3

(127,64) BCH Codes, order-4

(127,64) BCH Codes, order-4

(127,64) BCH Codes, order-5

(127,64) BCH Codes, order-5

(127,64) BCH, Proposed2

(127,64) BCH Codes, Proposed2

(127,64) BCH Codes, order-4, Proposed2

(127,64) BCH Codes, order-4, Proposed2

(255,131) BCH Codes, order-1

(255,131) BCH Codes, order-1

(255,131) BCH Codes, order-2

(255,131) BCH Codes, order-2

(255,131) BCH Codes, order-3

(255,131) BCH Codes, order-3

(255,131) BCH Codes, order-4

(255,131) BCH Codes, order-4

(255,131) BCH Codes, Proposed2

(255,131) BCH Codes, Proposed2

(255,131) BCH Codes, order-4, Proposed2

(255,131) BCH Codes, order-4, Proposed2

METHOD AND APPARATUS FOR FAST DECODING LINEAR CODE BASED ON SOFT DECISION

TECHNICAL FIELD

The present invention relates to methods and apparatuses for fast decoding a linear code based on soft decision, and more specifically, to techniques for fast decoding by omitting some of calculation processes in a soft decision-based linear code decoding method.

BACKGROUND ART

In digital communications, a decision means a threshold decision according to quantization in a demodulator located just before a decoder. In this case, a decision scheme may be classified into a hard decision and a soft decision.

The hard decision means that a waveform output by the demodulator is demodulated only to a binary signal (e.g., '0' or '1') and then decoded. On the other hand, the soft decision means that the output of the demodulator is demodulated into a quantized signal of two or more stages and then decoded, instead of making an integer decision as in the hard decision.

The hard decision may cause irreversible loss of information at a receiver, but requires less data processing and is simple to implement. On the other hand, although the soft decision requires more data processing and implementation thereof is complicated, it is often used because it has superior decoding performance as compared to the hard decision.

Meanwhile, decoding of the soft decision signal into an original signal is performed through a combination of information such as a conditional probability or likelihood of the soft decision signal. The ordered statistics decoding (OSD), which is one of such the soft decision-based decoding schemes, has received much attention because it shows a performance close to the maximum likelihood (ML) scheme.

However, since the OSD is similar to a scheme of finding a codeword most similar to received data among all codewords, the operation complexity of the OSD is very high. Therefore, there is a need for a method capable of maintaining high decoding performance while reducing computational complexity.

DISCLOSURE

Technical Problem

An objective of the present invention for solving the above-described problem is directed to providing a method for fast decoding a linear code based on soft decision.

Another objective of the present invention for solving the above-described problem is directed to providing an apparatus for fast decoding a linear code based on soft decision.

Technical Solution

In order to achieve the above described objection, the present invention provides methods for fast decoding a linear code based on soft decision.

An exemplary embodiment of the present invention for achieving the objective, as a method for fast decoding a linear code based on soft decision, may comprise sorting received signals in a magnitude order to obtain sorted signals; obtaining hard decision signals by performing hard decision on the sorted signals; obtaining upper signals corresponding to most reliable bases (MRBs) from the hard decision signals; obtaining a permuted and corrected codeword candidate using the upper signals and an error vector according to a current order; calculating a cost for the current order using a cost function; determining the permuted and corrected codeword candidate as a permuted and corrected codeword according to a result of comparing the calculated cost with a minimum cost; and determining a predefined speeding condition.

The obtaining of the permuted and corrected codeword candidate may comprise obtaining the permuted and corrected codeword candidate by multiplying the upper signals and the error vector according to the current order with a permuted generator matrix.

The cost function may be defined as an operation of summing magnitudes of components of the sorted signals, which correspond to positions where the permuted corrected codeword candidate and the hard decision signals have different values. The error vector may be defined as a vector having a same length as the MRBs and a hamming weight equal to the current order.

The determining of the predefined speeding condition may comprise calculating a speeding threshold by summing components having small magnitudes among components of the sorted signals corresponding to the MRBs; and comparing the calculated speeding threshold with the minimum cost.

The method may comprise, after the comparing, obtaining the permuted and corrected codeword candidate for a next order of the current order in response to determining that the speeding threshold is smaller than the minimum cost as a result of the comparison.

The calculating of the speeding threshold may comprise calculating the speeding threshold by adding a sum of the components having small magnitudes to a function having a signal-to-noise ratio (SNR), an order, and an error correction code as parameters.

The method may further comprise, after the obtaining of the permuted and corrected codeword candidate, comparing a hamming distance between the hard decision signals and the permuted and corrected codeword candidate with a first preconfigured threshold.

The method may further comprise, after the comparing the hamming distance with the first preconfigured threshold, in response to determining that the hamming distance is greater than the first preconfigured threshold as a result of the comparison, omitting operations on the error vector and obtaining the permuted and corrected codeword candidate by changing the error vector according to the current order.

The method may further comprise, after the obtaining of the permuted and corrected codeword candidate, comparing a hamming distance between the hard decision signals and the permuted and corrected codeword candidate with a second preconfigured threshold; and in response to determining that the hamming distance is less than the second preconfigured threshold, omitting the calculating of the cost, and immediately determining the permuted and corrected codeword candidate as the permuted and corrected codeword.

In order to achieve the above described objection, the present invention provides apparatuses for fast decoding a linear code based on soft decision.

Another exemplary embodiment of the present invention for achieving the objective, as an apparatus for decoding a linear code based on soft decision at a high speed, may comprise at least one processor; and a memory storing instructions causing the at least one processor to perform at least one step, wherein the at least one step comprises sorting received signals in a magnitude order to obtain sorted signals; obtaining hard decision signals by performing hard decision on the sorted signals; obtaining upper signals corresponding to most reliable bases (MRBs) from the hard decision signals; obtaining a permuted and corrected codeword candidate using the upper signals and an error vector according to a current order; calculating a cost for the current order using a cost function; determining the permuted and corrected codeword candidate as a permuted and corrected codeword according to a result of comparing the calculated cost with a minimum cost; and determining a predefined speeding condition.

The obtaining of the permuted and corrected codeword candidate may comprise obtaining the permuted and corrected codeword candidate by multiplying the upper signals and the error vector according to the current order with a permuted generator matrix.

The cost function may be defined as an operation of summing magnitudes of components of the sorted signals, which correspond to positions where the permuted corrected codeword candidate and the hard decision signals have different values.

The error vector may be defined as a vector having a same length as the MRBs and a hamming weight equal to the current order.

The determining of the predefined speeding condition may comprise calculating a speeding threshold by summing components having small magnitudes among components of the sorted signals corresponding to the MRBs; and comparing the calculated speeding threshold with the minimum cost.

The at least one step may comprise, after the comparing, obtaining the permuted and corrected codeword candidate for a next order of the current order in response to determining that the speeding threshold is smaller than the minimum cost as a result of the comparison.

The calculating of the speeding threshold may comprise calculating the speeding threshold by adding a sum of the components having small magnitudes to a function having a signal-to-noise ratio (SNR), an order, and an error correction code as parameters.

The at least one step may further comprise, after the obtaining of the permuted and corrected codeword candidate, comparing a hamming distance between the hard decision signals and the permuted and corrected codeword candidate with a first preconfigured threshold.

The at least one step may further comprise, after the comparing the hamming distance with the first preconfigured threshold, in response to determining that the hamming distance is greater than the first preconfigured threshold as a result of the comparison, omitting operations on the error vector and obtaining the permuted and corrected codeword candidate by changing the error vector according to the current order.

The at least one step may further comprise, after the obtaining of the permuted and corrected codeword candidate, comparing a hamming distance between the hard decision signals and the permuted and corrected codeword candidate with a second preconfigured threshold; and in response to determining that the hamming distance is less than the second preconfigured threshold, omitting the calculating of the cost, and immediately determining the permuted and corrected codeword candidate as the permuted and corrected codeword.

Advantageous Effects

In the case of using the method and apparatus for fast decoding a linear code based on soft decision according to the present invention as described above, the complexity of operation can be reduced while maintaining the decoding performance according to the OSD.

MODES OF THE INVENTION

Figure 1:
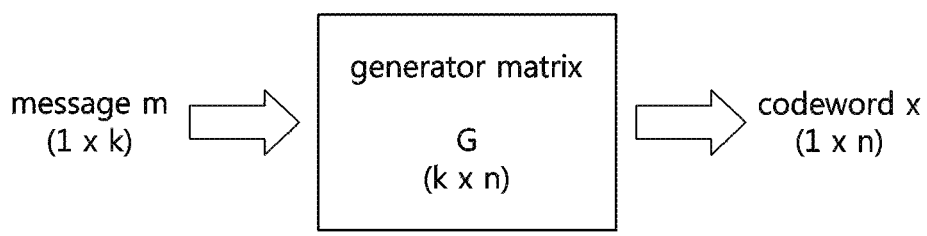
FIG. 1 is an exemplary diagram for describing a concept of linear encoding according to an exemplary embodiment of the present invention.

While the present invention is susceptible to various modifications and alternative forms, specific embodiments are shown by way of example in the drawings and described in detail. It should be understood, however, that the description is not intended to limit the present invention to the specific embodiments, but, on the contrary, the present invention is to cover all modifications, equivalents, and alternatives that fall within the spirit and scope of the present invention.

Although the terms "first," "second," etc. may be used herein in reference to various elements, such elements should not be construed as limited by these terms. These terms are only used to distinguish one element from another. For example, a first element could be termed a second element, and a second element could be termed a first element, without departing from the scope of the present invention. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directed coupled" to another element, there are no intervening elements.

The terminology used herein is for the purpose of describing particular embodiments only and is not intended to be limiting of embodiments of the present invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, parts, and/or combinations thereof, but do not preclude the presence or addition of one or more other features, integers, steps, operations, elements, parts, and/or combinations thereof.

Unless otherwise defined, all terms (including technical and scientific terms) used herein have the same meaning as commonly understood by those of ordinary skill in the art to which the present invention pertains. It will be further understood that terms defined in commonly used dictionaries should be interpreted as having a meaning that is consistent with their meaning in the context of the related art and will not be interpreted in an idealized or overly formal sense unless expressly so defined herein.

Hereinafter, exemplary embodiments of the present invention will be described in greater detail with reference to the accompanying drawings.

FIG. 1 is an exemplary diagram for describing a concept of linear encoding according to an exemplary embodiment of the present invention.

A block coding may refer to a coding scheme in which data is bundled into a predetermined block unit, and encoding and decoding are performed for each block. In addition, a linear coding may refer to a coding scheme in which a set of codewords forms a linear vector space (or satisfies a linear condition).

Referring to FIG. 1, a general linear coding process may be represented by using a generator matrix G. When a message m to be transmitted is expressed as a vector of 1×k, a codeword x expressed as a vector of 1×n may be derived by multiplying the message m by a generator matrix having a size of k×n. In the following description, k may mean a dimension (or a rank of the generator matrix), and n may mean the length of the codeword.

Here, the generator matrix for generating the codeword may be determined according to the codeword to be used. In general, the larger the minimum distance between the codewords is, the higher an error correction capability is. Here, the minimum distance may mean the smallest distance among hamming distances between the codewords. In addition, the hamming distance may mean the number of different symbols between two codewords.

The codeword linearly-coded through the above process may be transmitted from a transmitting side to a receiving side of a wired or wireless communication system. The receiving side may recover an original waveform through a demodulator, and use a decoder to detect errors mixed in the recovered waveform and recover the valid codeword (or data symbols).

Hereinafter, methods and apparatuses for fast decoding a linear code based on soft decision according to exemplary embodiments of the present invention will be described based on the above concepts.

Also, in the following description, for convenience of description, a transmission channel is assumed to have additive white Gaussian noise (AWGN), and a binary phase shift keying (BPSK) is used as a modulation scheme. However, the present invention should not be construed as limited to the channel or the modulation scheme.

Figure 2:
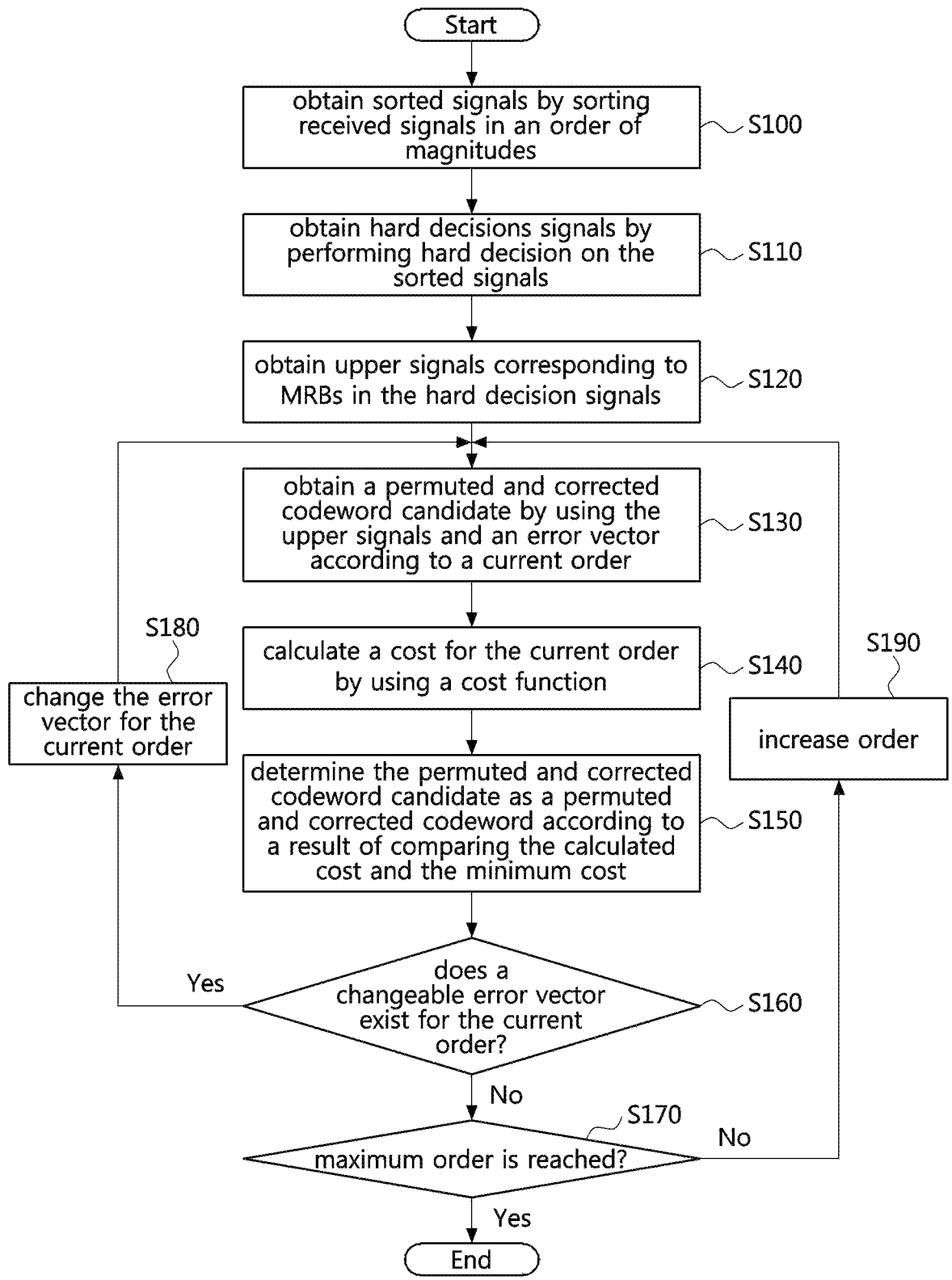
FIG. 2 is a flowchart illustrating a decoding method of an ordered statistics decoder (OSD) according to an exemplary embodiment of the present invention.

FIG. 2 is a flowchart illustrating a decoding method of an ordered statistics decoder (OSD) according to an exemplary embodiment of the present invention.

Referring to FIG. 2, in an OSD according to an exemplary embodiment of the present invention, sorted signals may be obtained by first sorting signals received from a demodulator in an order of magnitudes (S100). For example, when $r=(r_0, r_1, \ldots, r_{n-1})$ are received signals (here, n may be the length of the codeword), absolute values may be obtained for the respective components (e.g., $r_0, r_1, \ldots, r_{n-1}$) of the received signals, and they may be sorted in the order of magnitudes so as to obtain the sorted signals $y=(y_0, y_1, \ldots, y_{n-1})$ (hereinafter, the sorted signals may be referred to as 'y'). Here, the sorting order may be a descending order, but is not necessarily limited thereto, and the sorting may not necessarily mean sorting in the order of precise magnitudes.

As a next step of the step S100, a hard decision signal may be obtained by performing hard decision on the sorted signals y (S110). For example, the hard decision signals $Y=(Y_0, Y_1, \ldots, Y_{n-1})$ may be obtained by performing hard decision Ron the sorted signals y (hereinafter, the hard decision signals may be referred to as 'Y'). When the hard decision signals Y are obtained, upper signals corresponding to Most Reliable Bases (MRBs) may be obtained from the hard decision signals (S120; hereinafter, the upper signals may be referred to as 'a') Specifically, in the hard decision signals, the upper k components (where k may be the dimension described in FIG. 1) having large magnitudes are classified into the MRBs, the remaining (n-k) components are classified into least reliable bases (LRBs), and the upper signals α having the upper k components may be obtained.

As a next step of the step S120, a permuted and corrected codeword candidate may be obtained using the upper signals α and an error vector according to an order (hereinafter, referred to as 'o') (S130). Specifically, for example, when the error vector for an arbitrary order o is $k_o$ and a permuted generator matrix is G', the permuted and corrected codeword candidate $E_o$ for the arbitrary order o may be defined as shown in Equation 1 below $$(\alpha+k_o) \cdot G' = \alpha G' + k_o G' = E_o \qquad \text{[Equation 1]}$$

Referring to Equation 1, the permuted and corrected codeword candidate $E_o$ may be obtained by multiplying the upper signals α and the error vector $k_o$ according to the order by the permuted generator matrix G'. In more detail, the permuted corrected codeword candidate $E_o$ may be obtained by multiplying a sum of the upper signals α and the error vector $k_o$ according to the order by the permuted generator matrix G', or may be obtained as a sum of a value obtained by multiplying the upper signals α by the permuted generator matrix G' and a value obtained by multiplying, the error vector $k_o$ by the permuted generator matrix G In this case, the permuted generator matrix may be obtained by permuting columns of the generator matrix G described in FIG. 1 in the same order as that in which the sorted signals y were generated and performing Gaussian elimination on them. In addition, the permuted and corrected codeword candidate may have a permuted order according to the permutation order of the permuted generator matrix, and may be defined as a candidate of the corrected codeword. In this case, the permuted generator matrix G' may have a form as shown in Equation 2 below.

$$G'=[IP] \qquad [\text{Equation 2}]$$

Referring to Equation 2, I may be an identity matrix having a size of k×k, and P may be a matrix having a size of k×(n−k) In this case, when the form is not the same as that of Equation 2, the form according to Equation 2 may be derived by appropriately permuting the columns of the generator matrix G according to FIG. 1. In this case, the permutation order for deriving the permuted generator matrix G' may have to be the same as the order of the sorted signals.

Meanwhile, the error vector may be interpreted as a vector indicating components predicted to have errors (or a vector indicating components predicted to have hard decision signals different from those of the permuted and corrected codeword candidate among components corresponding to the MRBs of the sorted signals) Specifically, the error vector may be defined as a vector which has the same length as the MRBs (i.e., length of k) and has a hamming weight (the number of non-zero components in the codeword) equal to the current order o. For example, when the order is 0, the error vector $k_o$ has a hamming weight of 0, and thus the error vector may be derived as in Equation 3 below.

$$k_0=(0,0,0,\ldots 0) \qquad [\text{Equation 3}]$$

That is, the error vector according to the case where the order is 0 may be a vector in which k components are all zero. In addition, an error vector for the case where the order is 1 may be derived as in Equation 4 below.

$$k_1=(0,1,0,\ldots,0) \qquad [\text{Equation 4}]$$

In Equation 4, the position of the component having the value of 1 (or the position of the component predicted to have an error) may vary. That is, a total of k $k_1$'s may be derived according to the selected position. In addition, the error vector $k_2$ for the case where the order is 2 may be derived by selecting two positions from the MRBs, having 1 (or non-zero value) as component values only for the selected positions and the remaining component values as zero.

The permuted and corrected codeword candidate may be a candidate that is likely to be a codeword error-corrected and permuted similarly to the permuted generator matrix, and may be evaluated through a cost function according to the error vector. For example, when the error vector is a vector having 1 as the j-th component value as shown in Equation 4 (i.e., when predicted to have a hard decision signal different from that of the permuted and corrected codeword candidate in the j-th component among the components corresponding to the Mins of the sorted signals), the cost function may be defined as in Equation 5 below.

$$s' = |y_j| + \sum_{\substack{i=k \\ Y_i \neq E_i}}^{n-1} |y_i| \qquad [\text{Equation 5}]$$

Referring to Equation 5 above, the cost function may be defined as a value obtained by summing the magnitude of the j-th component of the sorted signals y and the magnitudes of the components corresponding to the positions in which the permuted and corrected codeword candidate E and the hard decision signal $Y_i$ have different values. In addition, as shown in Equation 3, since a cost function for the error vector whose all components are zero does not have components indicated by the error vector, the cost function may be defined as in Equation 6 below $$s = \sum_{\substack{i=k \\ Y_i \neq E_i}}^{n-1} |y_i| \qquad [\text{Equation 6}]$$

Specifically, referring to Equation 6, the cost function for the error vector of the order 0 according to Equation 3 may be defined as a value obtained by summing the magnitudes of the components corresponding to the positions in which the permuted and corrected codeword candidate and the hard decision signals have different values among the components corresponding to (n−k) LRBs.

In the same manner as in Equations 5 and 6, when non-zero components indicated by the error vector of the order 2 are the l-th component and the m-th component, the cost function may be defined as Equation 7 below.

$$s' = |y_l| + |y_m| \sum_{\substack{i=k \\ Y_i \neq E_i'}}^{n-1} |y_i| \qquad [\text{Equation 7}]$$

That is, when Equations 5 to 7 are summarized, the cost function may be defined as an operation of summing the magnitudes of the components corresponding to the positions in which the permuted and corrected codeword candidate and the hard decision signals have different values in the sorted signals.

Therefore, after the step S130, a cost for the current order may be calculated using the cost function (S140) Here, the current order may be a variable starting from 0 and increasing by one each time when the step S130 is performed.

When the cost for the current order is calculated in the step S140, the permuted and corrected codeword candidate may be determined as a permuted and corrected codeword according to a result of comparing the calculated cost with the minimum cost (S150) Here, the minimum cost may mean a minimum value among costs calculated for from the order 0 to the current order. Referring to the step S150 in more detail, when the calculated cost is less than the minimum cost, the permuted and corrected codeword candidate may be determined as the permuted and corrected codeword. In addition, when the cost calculated in the step S150 is less than the minimum cost, the minimum cost may be updated by the calculated cost. On the other hand, when the order is 0, the cost calculated according to the step S140 may be determined as the minimum cost, and the permuted and corrected codeword candidate may be determined as the permuted and corrected codeword.

After the step S150, it may be determined whether an error vector changeable in the current order exists (S160), and when an error vector changeable in the current order exists, the error vector may be changed (S180), and the process according to the step S130 may be re-performed. Here, the change of the error vector may be performed by changing the positions of non-zero components (or components having a value of 1) in the error vector.

After the step S160, it may be determined whether the current order has reached a preconfigured maximum order (S170), and when the maximum order is reached, the encoding process may be ended. However, when the maximum order is not reached, the current order may be increased by one (S190), and the process may be performed again from the step S130 Here, the maximum order is a value that can be input by a user, and may be generally derived by Equation 8 below $$\min\left(k, \left\lfloor \frac{d}{4} \right\rfloor\right) \qquad \text{[Equation 8]}$$

In Equation 8, d may mean the minimum distance of the code, k may mean a dimension.

Figure 3:
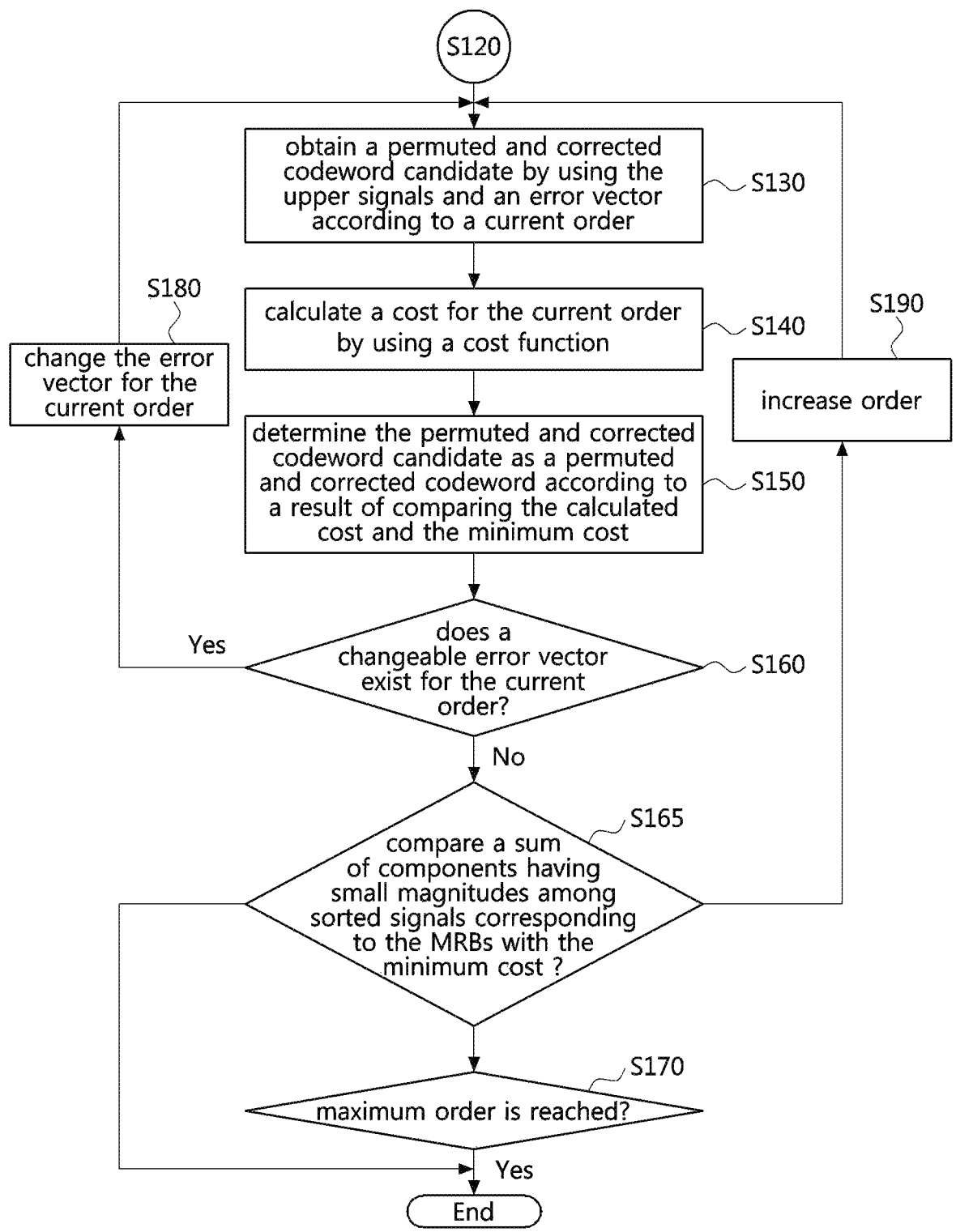
FIG. 3 is a flowchart illustrating a decoding method based on probabilistic necessary conditions (PNC) according to an exemplary embodiment of the present invention.

FIG. 3 is a flowchart illustrating a decoding method based on probabilistic necessary conditions (PNC) according to an exemplary embodiment of the present invention.

Since the OSD described with reference to FIG. 2 continuously calculates the cost function up to the preconfigured maximum order and derives the permuted and corrected codeword candidate, the operation complexity is high and unnecessary operations are repeatedly performed.

In order to reduce the computational complexity, a method of speeding the decoding by omitting operations for the subsequent orders even when the maximum order is not reached may be considered. In this case, a probabilistic necessary conditions (PNC) scheme may be used. In the PNC scheme, when there is no possibility that a cost lower than the minimum cost may exist even if the order is increased, the corrected codeword may be determined based only on the results examined so far.

Referring to FIG. 3, according to the PNC scheme, after the steps up to the step S160 according to FIG. 2 are performed, the determination according to a step S165 may be performed instead of the step S170 of determining whether the maximum order is reached. That is, a sum (hereinafter, referred to as 'speeding threshold') of components having small magnitudes among the components of the sorted signals corresponding to the MRBs may be compared with the minimum cost determined up to the current order (S165). In this case, since the number corresponding to the cost function operation for the next order of the current order should be considered, the components having small magnitudes may be selected as many as one more than the current order, and summed.

For example, when the current order is o, the speeding threshold $S_{PNC}$ for determining whether to perform the operation for the next order o+1 may be defined as in Equation 9 below.

$$S_{PNC(o+1)} = \sum_{j=k-o-1}^{k-1} |y_j| \qquad \text{[Equation 9]}$$

Referring to Equation 9, when the sorted signals are obtained by the descending order sorting, the speeding threshold $S_{PNC}$ may be determined by summing (o+1) components backward from the (k−1)-th component that is the last component among the MRBs of the sorted signals. On the other hand, when the sorted signals are obtained by the ascending order sorting, the components corresponding to from j=0 to j=o may be summed.

If the sum of the components having small magnitudes is greater than the minimum cost according to a result of the comparison in the step S165, the costs for the subsequent orders are likely to be greater than the minimum cost according to the current order, and thus there is no or very low possibility that the current permuted and corrected codeword candidate becomes the corrected codeword Therefore, if the sum of the components having small magnitudes is greater than the minimum cost according to the result of the comparison in the step S165 the processes S130 to S150 for repeating the operations by increasing the order (S190) may be omitted, and the decoding may be terminated.

Figure 4:
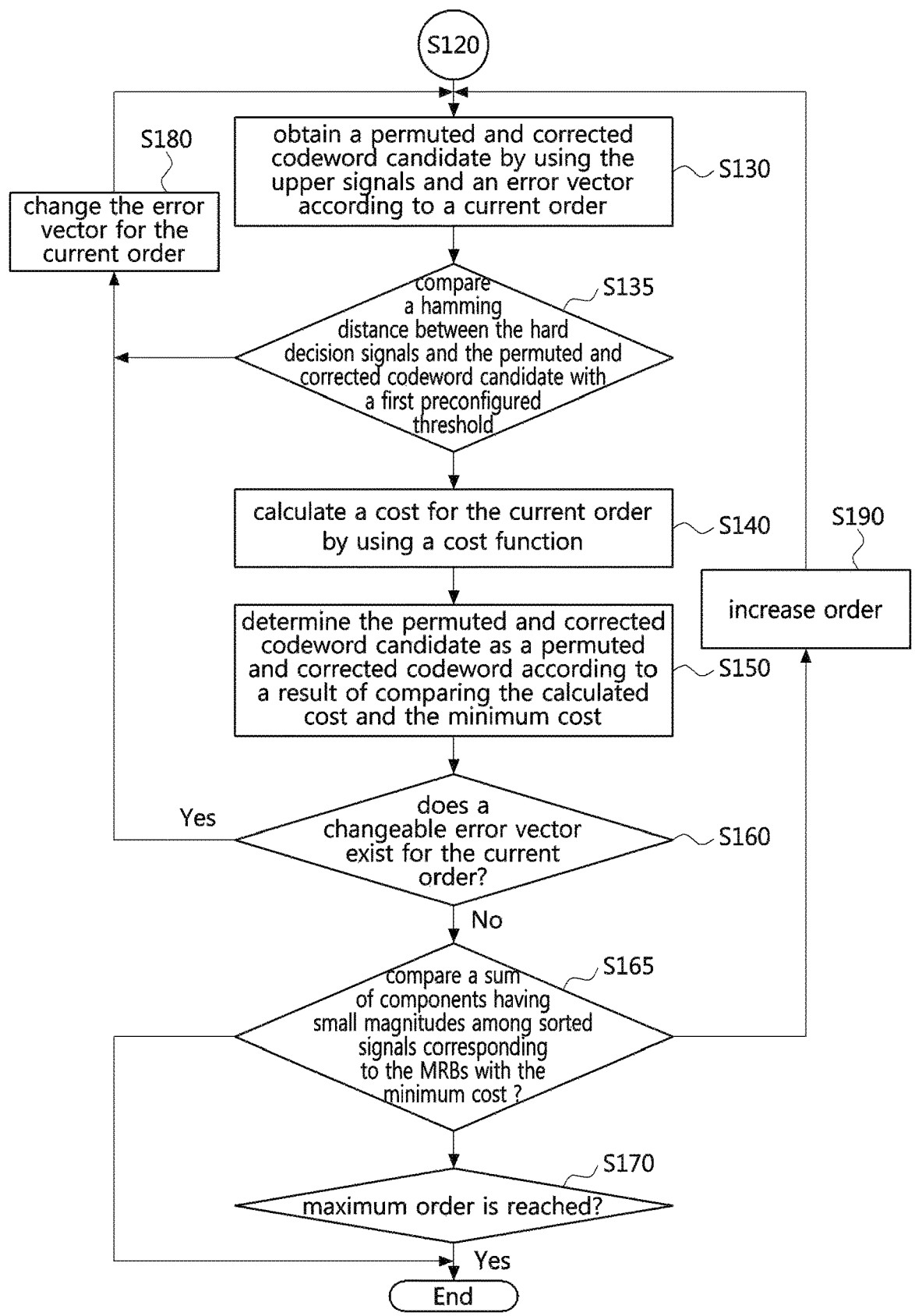
FIG. 4 is a flowchart illustrating a decoding method based on probabilistic sufficient conditions (PSC) according to an exemplary embodiment of the present invention.

FIG. 4 is a flowchart illustrating a decoding method based on probabilistic sufficient conditions (PSC) according to an exemplary embodiment of the present invention.

According to an exemplary embodiment of the present invention, another exemplary embodiment (PSC, probabilistic sufficient conditions) to reduce the amount of computation by improving the OSD according to FIG. 2 may be provided.

Referring to FIG. 4, according to the PSC scheme, a process according to a step S135 may be performed instead of the step S140 after performing the step S130 according to FIG. 2. That is, in the step S135, the hamming distance between the hard decision signals Y and the permuted and corrected codeword candidate $E_o$ according to the current order o may be compared with a first preconfigured threshold (S135), the operations S140 to S150 for the current error vector may be omitted according to the comparison result, and the error vector of the current order may be changed (S180) so as to obtain the corrected codeword (S130).

Specifically, when the hamming distance between the hard decision signals and the permuted corrected codeword candidate is greater than (or greater than or equal to) the first preconfigured threshold, the permuted and corrected codeword candidate is unlikely to become an actual corrected codeword. Therefore, the operations on the current error vector may be omitted, and other codeword candidates of the current order may be calculated.

Figure 5:
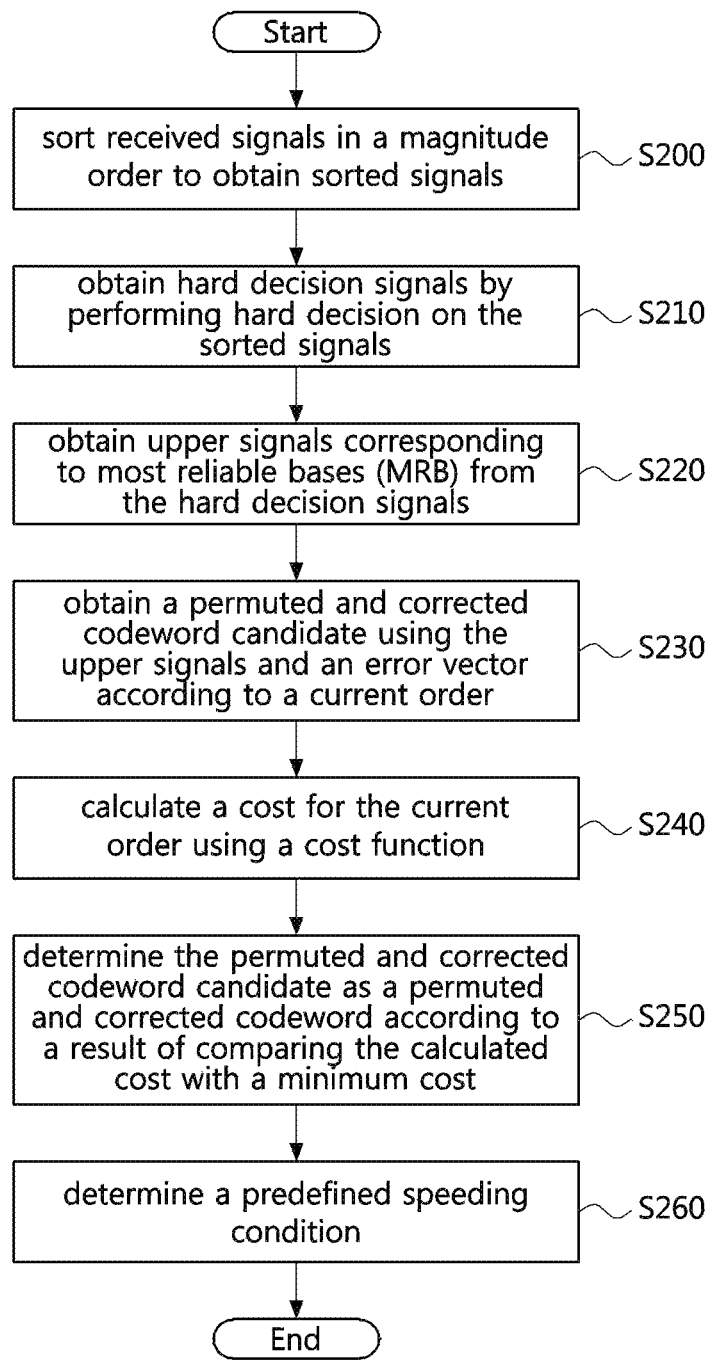
FIG. 5 is a flowchart illustrating a method of fast decoding a linear code based on soft decision according to an exemplary embodiment of the present invention.
Figure 6A:
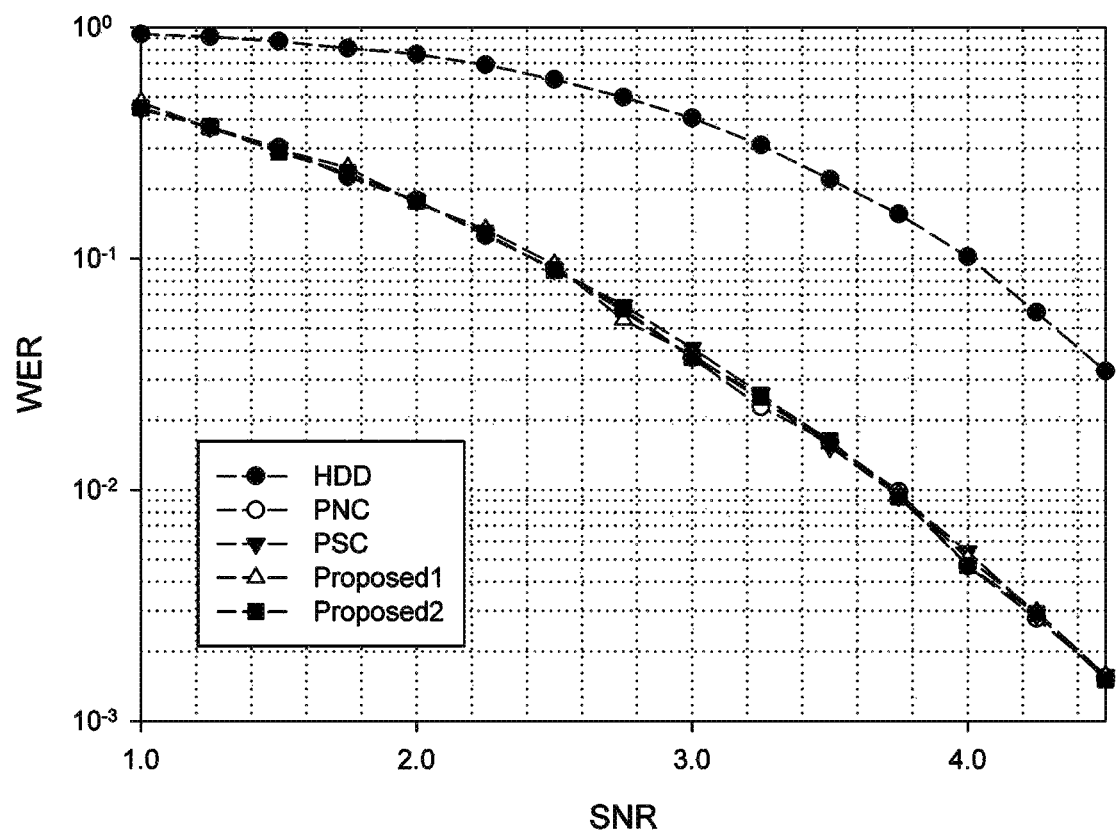
FIGS. 6A to 6J are graphs of analyzing decoding performance and speed of the proposed methods according to exemplary embodiments of the present invention, for each order.
Figure 6B:
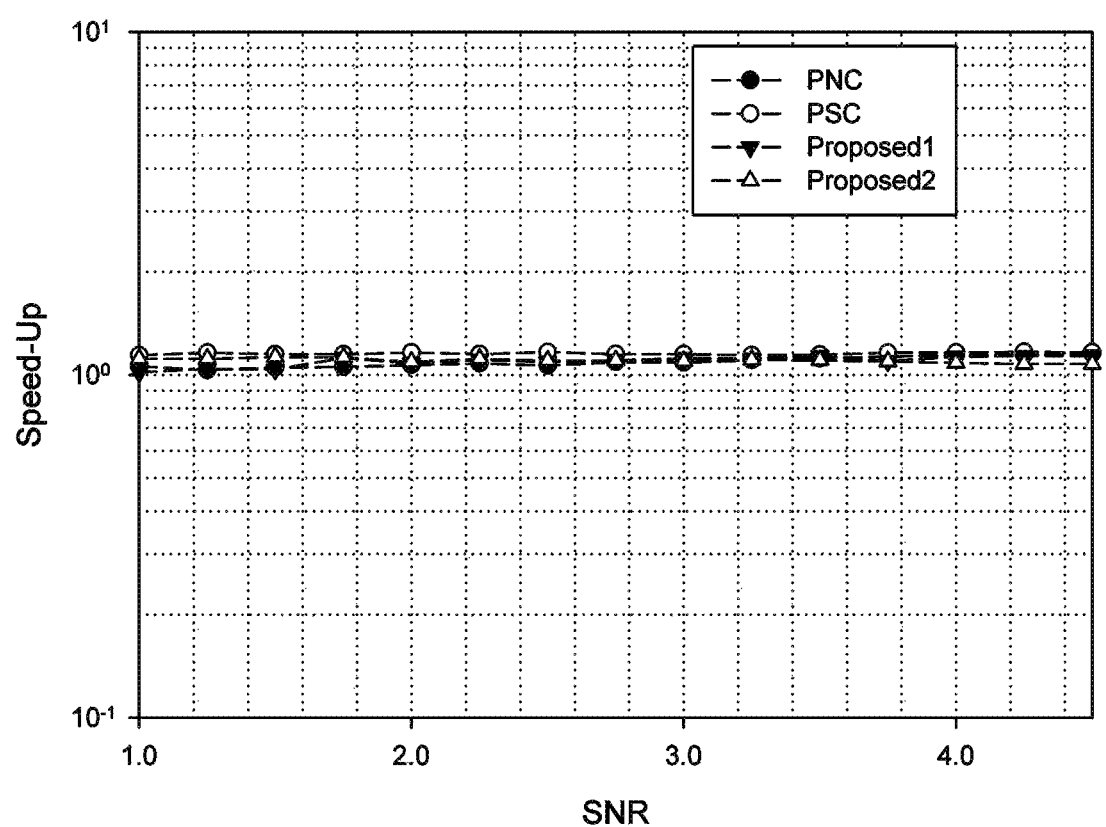
Figure 6C:
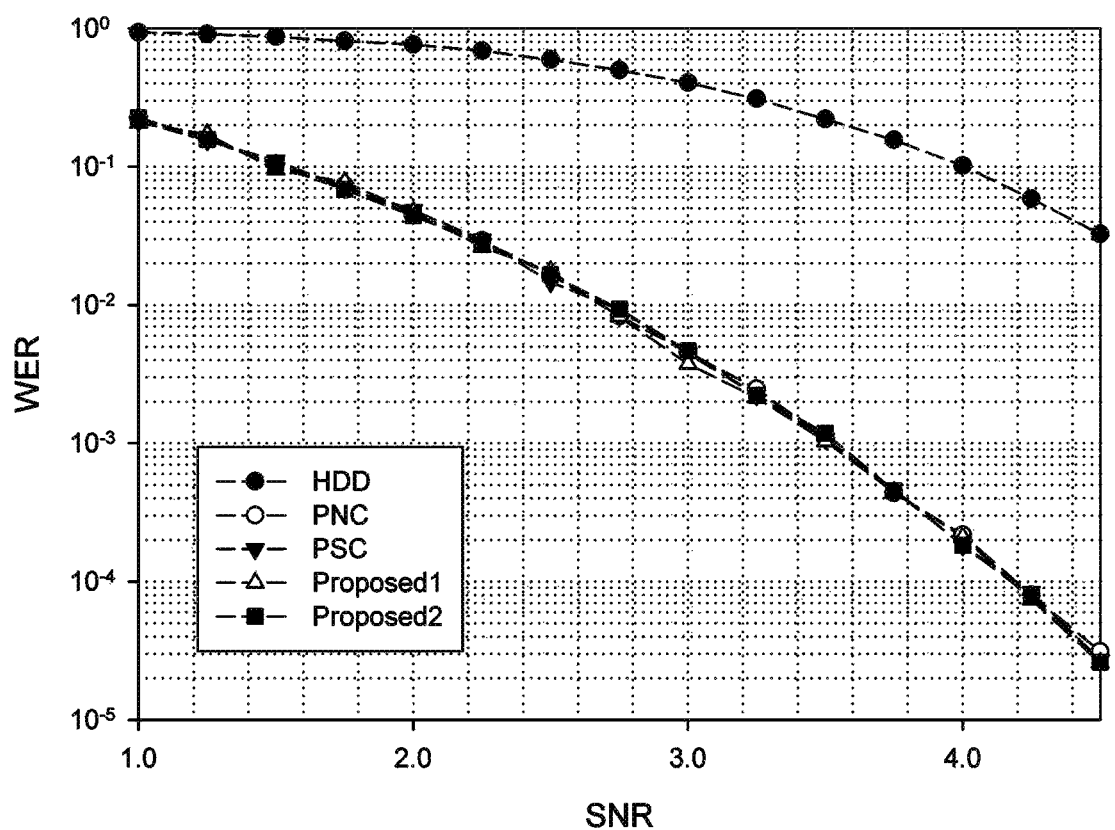
Figure 6D:
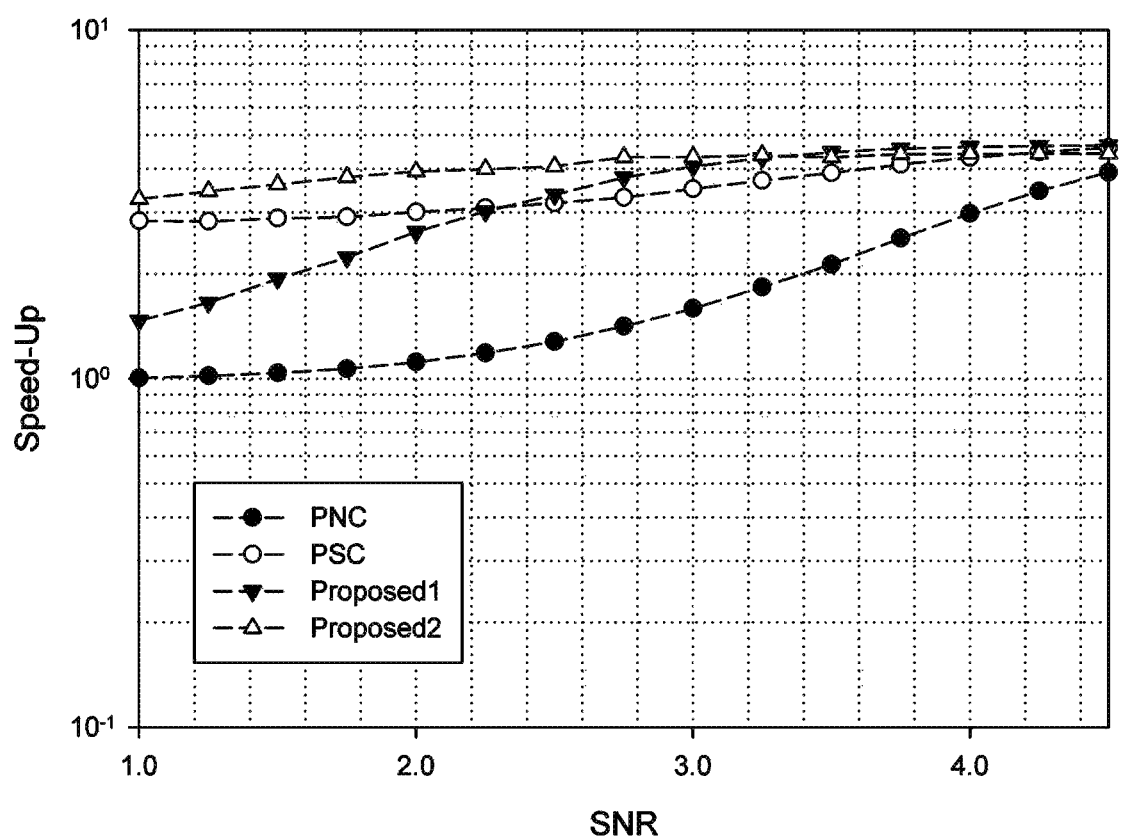
Figure 6E:
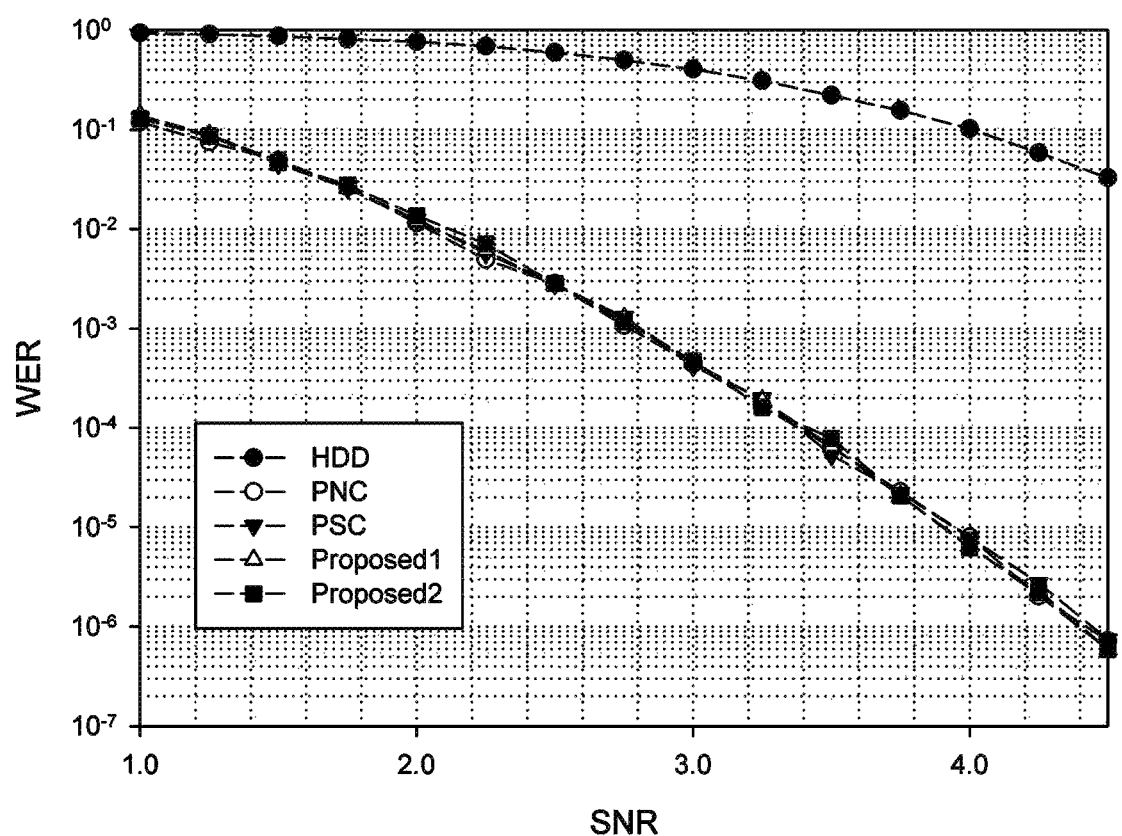
Figure 6F:
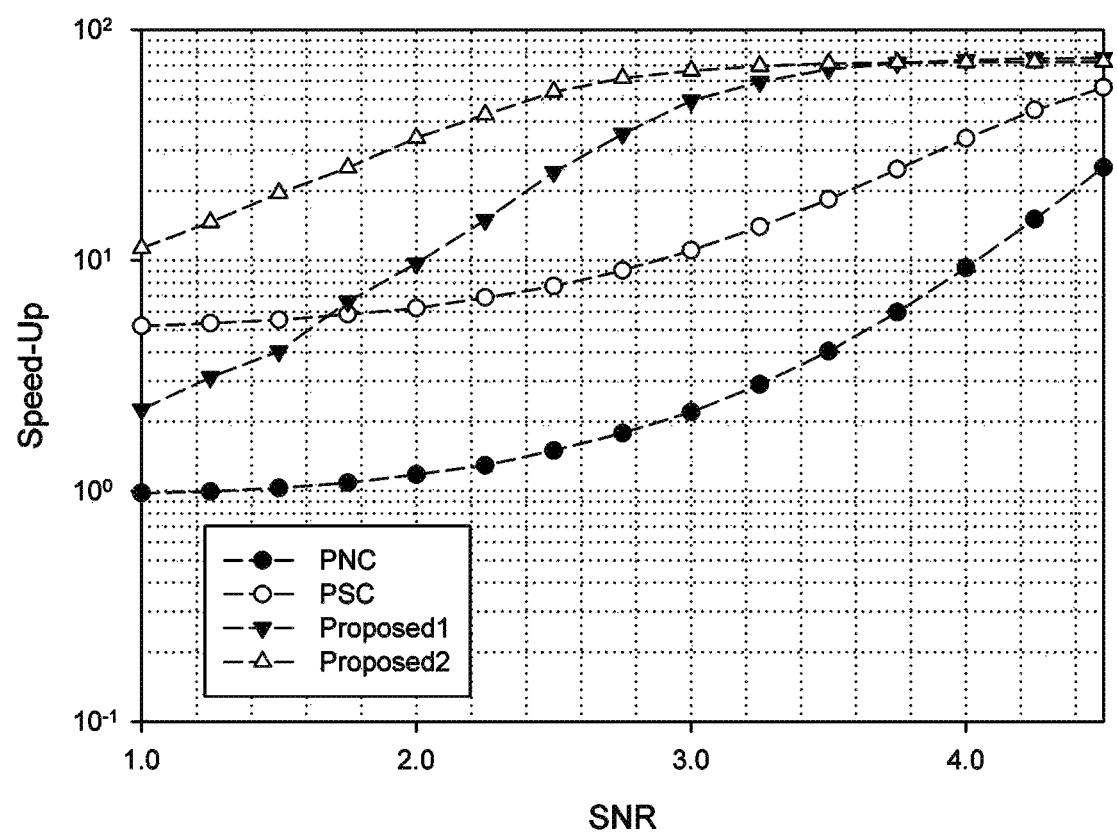
Figure 6G:
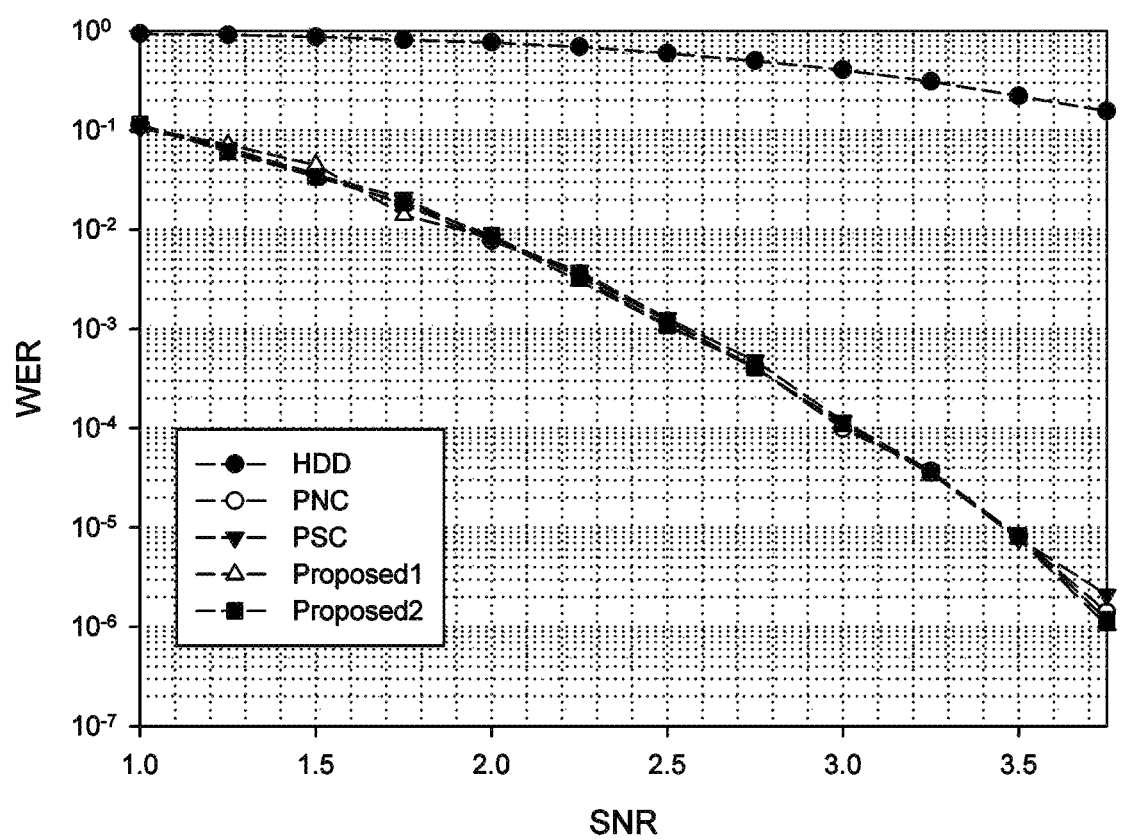
Figure 6H:
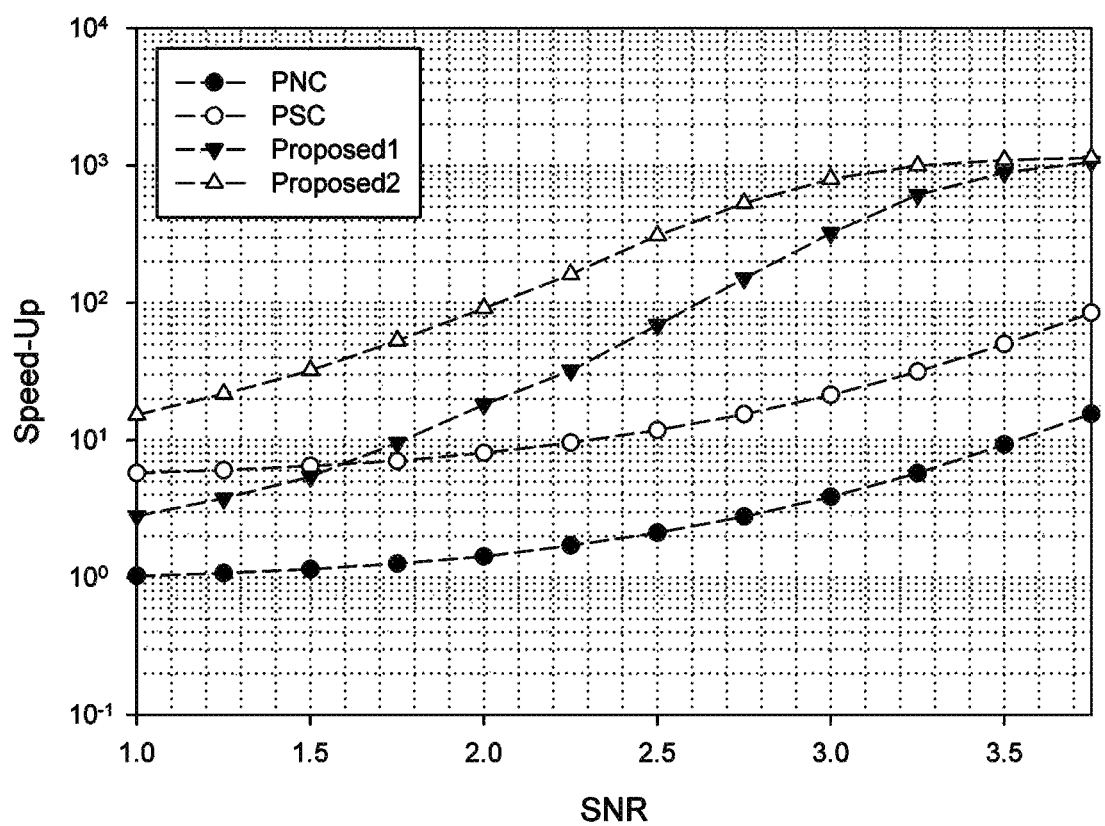
Figure 6I:
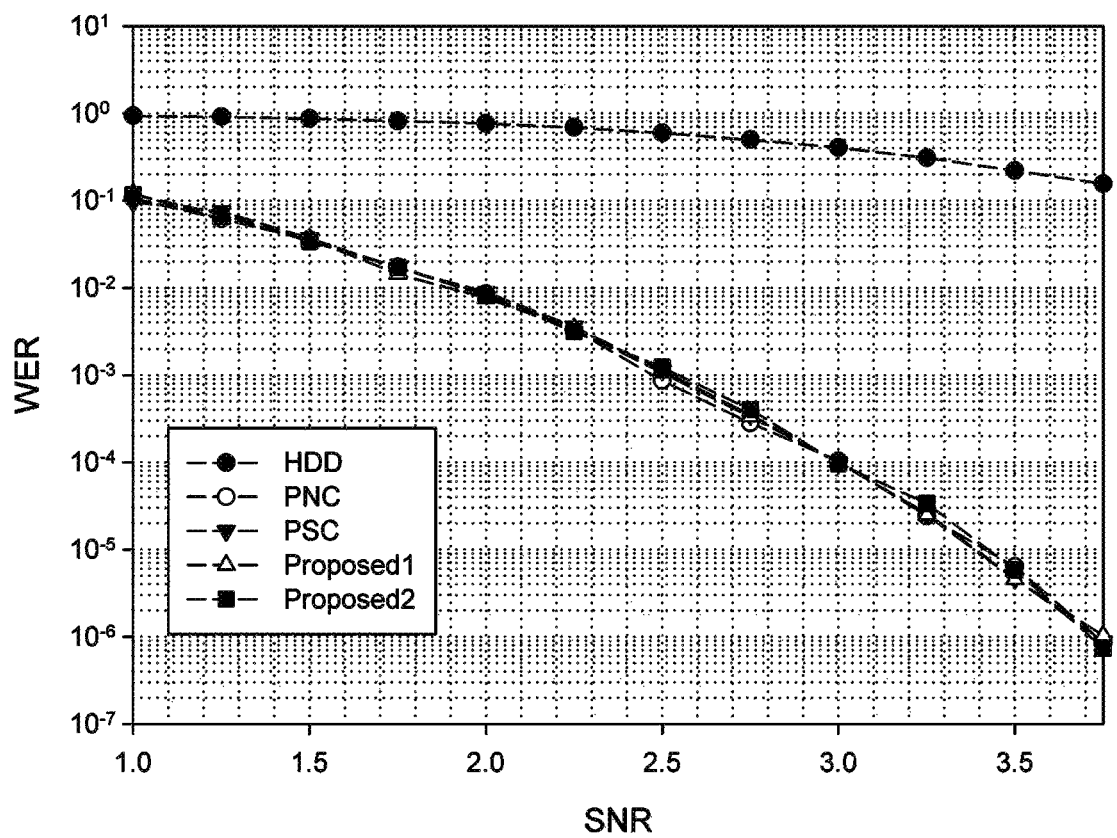
Figure 6J:
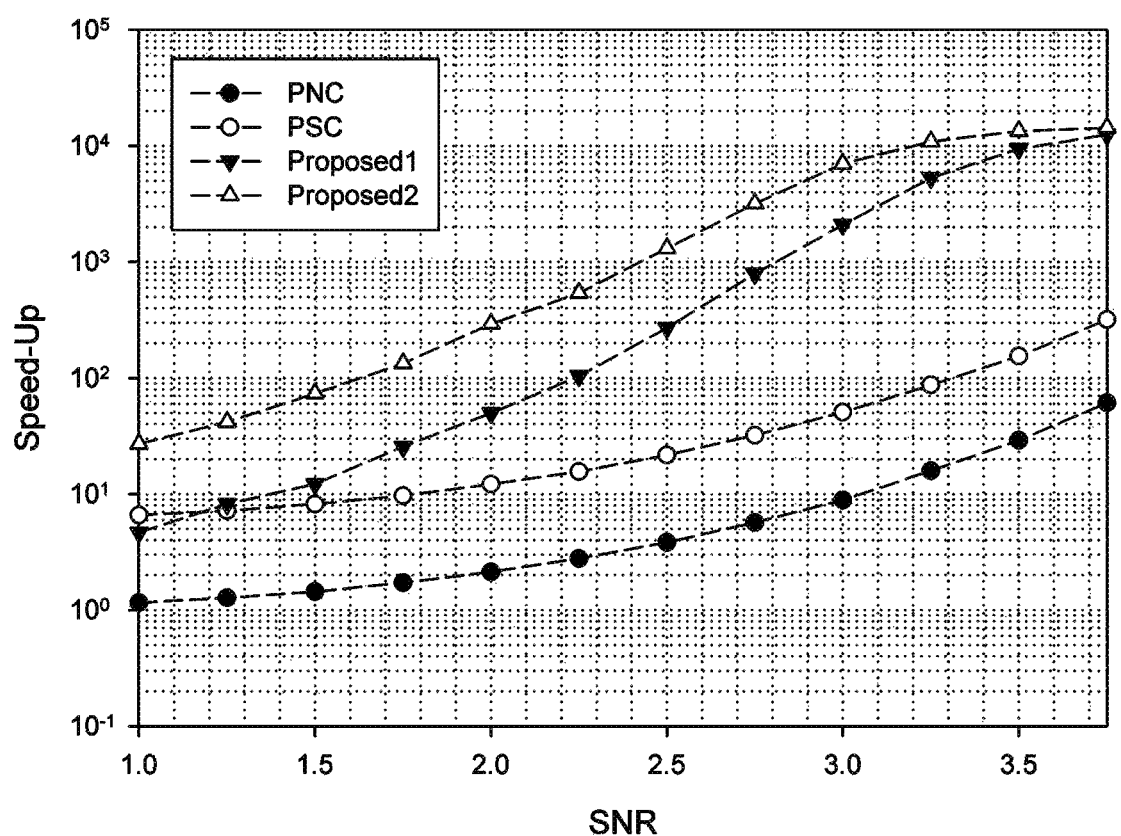

FIG. 5 is a flowchart illustrating a method of fast decoding a linear code based on soft decision according to an exemplary embodiment of the present invention.

Referring to FIG. 5, a method for fast decoding a linear code based on soft decision may comprise a step S200 of sorting received signals in a magnitude order to obtain sorted signals; a step S210 of obtaining hard decision signals by performing hard decision on the sorted signals; a step S220 of obtaining upper signals corresponding to most reliable bases (MRBs) from the hard decision signals; a step S230 of obtaining a permuted and corrected codeword candidate using the upper signals and an error vector according to a current order; a step S240 of calculating a cost for the current order using a cost function; a step S250 of determining the permuted and corrected codeword candidate as a permuted and corrected codeword according to a result of comparing the calculated cost with a minimum cost; and a step S260 of determining a predefined speeding condition.

The step S230 of obtaining the permuted and corrected codeword candidate may comprise obtaining the permuted and corrected codeword candidate by multiplying the upper signals and the error vector according to the current order with a permuted generator matrix. For example, the permuted and corrected codeword candidate may be obtained based on Equation 1 above.

The cost function may be defined as an operation of summing magnitudes of components of the sorted signals, which correspond to positions where the permuted corrected codeword candidate and the hard decision signal have different values. For example, the cost function may refer to Equations 5 to 7.

The error vector is defined as a vector having a same length as the MRBs and a hamming weight equal to the current order. For example, the error vector may refer to Equations 3 and 4.

The step S260 of determining the predefined speeding condition may comprise calculating a speeding threshold by summing components having small magnitudes among components of the sorted signal corresponding to the MRBs; and comparing the calculated speeding threshold with the minimum cost. For example, the step S260 of determining the predefined speeding condition may refer to the description according to FIG. 3, and the speeding threshold may refer to Equation 9.

The method may comprise, after the comparing, obtaining the permuted and corrected codeword candidate for a next order of the current order in response to determining that the speeding threshold is smaller than the minimum cost as a result of the comparison.

The method may comprise, after the step S230 of obtaining the permuted and corrected codeword candidate, comparing a hamming distance between the hard decision signals and the permuted and corrected codeword candidate with a first preconfigured threshold. For example, the step of comparing the hamming distance with the first preconfigured threshold may refer to the description according to FIG. 4.

The method may comprise, after the comparing of the hamming distance and the first preconfigured threshold, in response to determining that the hamming distance is greater than the first preconfigured threshold as a result of the comparison, obtaining the permuted and corrected codeword candidate by changing the error vector according to the current order. More specifically, reference may be made to the description according to FIG. 4.

Meanwhile, as a result of determination by the predefined speeding condition with respect to the current order o in the step S165, if it is determined to perform the step S130 for the next order o+1, the cost calculated for the order o+1 in the step S140 may be expressed as in Equation 10 below $$S_{o+1} = \sum_{j=1}^{o+1} |y_{[j]}| + \gamma \quad \text{[Equation 10]}$$

Referring to Equation 10, a front part may correspond to the front parts in Equations 5 to 7 as an operation of summing magnitudes for (o+1) components indicated by the error vector in the sorted signals y according to the MRBs. Also, a rear part of Equation 10 may correspond to the rear parts of Equations 5 to 7 as a partial sum of reliabilities of symbols corresponding to the LRBs.

In general, since the LRBs are low reliability values, errors are more likely than components corresponding to the MRBs Therefore, y in Equation 10 may be expected to have a value greater than zero. Using this point, the speeding threshold defined in Equation 9 (threshold for deciding whether to omit operations on the next order o+1) may be changed as in Equation 11 below.

$$S_{proposed(o+1)} = S_{PNC(o+1)} + f(SNR, code, o+1) \quad \text{[Equation 11]}$$

Referring to Equation 11, a newly defined speeding threshold $S_{proposed}$ may be defined as a value obtained by adding a value of a function (f) having parameters such as a signal-to-noise ratio (SNR), an order, and an error correction code to the speeding threshold $S_{PNC}$ defined in Equation 9.

Accordingly, the calculating of the speeding threshold may include calculating the speeding threshold by adding the value of the function having parameters such as a signal-to-noise ratio (SNR), an order, and an error correction code to the sum of the components having small magnitudes.

Meanwhile, a second preconfigured threshold may be used additionally or by replacing the comparing the hamming distance with the first preconfigured threshold Specifically, the method may further comprise, after the obtaining of the permuted and corrected codeword candidate, comparing a hamming distance between the hard decision signals and the permuted and corrected codeword candidate with a second preconfigured threshold; and in response to determining that the hamming distance is less than the second preconfigured threshold, omitting the calculating of the cost, and immediately determining the permuted and corrected codeword candidate as the permuted and corrected codeword. That is, when the hamming distance is less than the second preconfigured threshold, all the subsequent processes including the step of calculating the cost may be omitted, the permuted and corrected codeword candidate may be immediately determined as the permuted and corrected codeword, and the decoding process may be terminated.

FIGS. 6A to 6J are graphs of analyzing decoding performance and speed of the proposed methods according to exemplary embodiments of the present invention, for each order.

In the following graphs, 'HDD' means general hard decision decoding, 'PNC' means the case of applying the step S165 according to FIG. 3, and 'PSC' means the case of further applying the step S135 according to FIG. 4 to the PNC. In addition, a 'proposed 1 (Method 1)' may mean the method in which the process of determining the speeding condition using the speeding threshold newly defined according to Equation 11 is applied and the step of calculating the cost based on the comparison between the second threshold and the hamming distance is omitted in the flow chart according to FIG. 5.

In addition, a 'proposed2 (Method 2)' may mean the method in which the operation on the current error vector is omitted by applying the step S135 according to FIG. 4 in addition to Method 1.

A Bose-Chaudhuri-Hocquenghem (BCH) code having a length n of 127, a dimension k of 64, and a minimum distanced of 21 is used for the codewords used in FIGS. 6A to 6J. In addition, considering that the minimum distance d of the HDD is 21, it is determined to correct all of 10 or less errors. In addition, the vertical axes in the graphs represent a word error rate (WER) or a decoding speed (speed-up) indicating the decoding performance. Also, the horizontal axes in the graphs represent signal-to-noise ratio (SNR). In this case, the decoding speed is a relative indication of how much faster the proposed method is than the full search algorithm of the OSD described in FIG. 2. In each experiment, all data were quantized to 7 bits, the first preconfigured threshold according to the PSC of FIG. 4 was set to 25, and the second preconfigured threshold according to the description of FIG. 5 was set to 10. In addition, in Method 1 (i.e., proposed 1) and Method 2 (i.e., proposed 2), 346.5, 346.5, 321.3, 270.9, and 270.9 were respectively used for the orders 1 to 5 as the value of the function (f) having the SNR (Signal to Noise Ratio), the order, and the error correction code as the parameters.

Referring to FIGS. 6A through 6J, comparison results with respect to the decoding performance and speed for the orders 1 to 5 may be confirmed. As can be seen from the graph, Method 1 and Method 2 are almost identical to with the PNC and the PSC in terms of the decoding performance. In addition, the decoding speeds of Method 1 and Method 2 are surely faster than the PNC and the PSC. In the case of Method 1, the decoding speed is slower than the PSC in the low SNR, but as the SNR increases, the method converges to the decoding speed of Method 2. In the case of Method 2, it can be seen that the decoding speed is much faster than all other methods.

Specifically, Method 1 and Method 2 are up to about 13770 times (Method 1) and 14609 times (Method 2) faster than the OSD-FS according to each order, and up to about 336 times (Method 1) and 797 times faster (Method 2) faster than the PNC. Also, they are about 61 times (Method 1) and 139 times (Method 2) faster than the PSC.

FIGS. 7A to 7D are graphs of analyzing decoding performance and speed according to Method 2 among the proposed methods according to exemplary embodiments of the present invention.

Figure 7A:
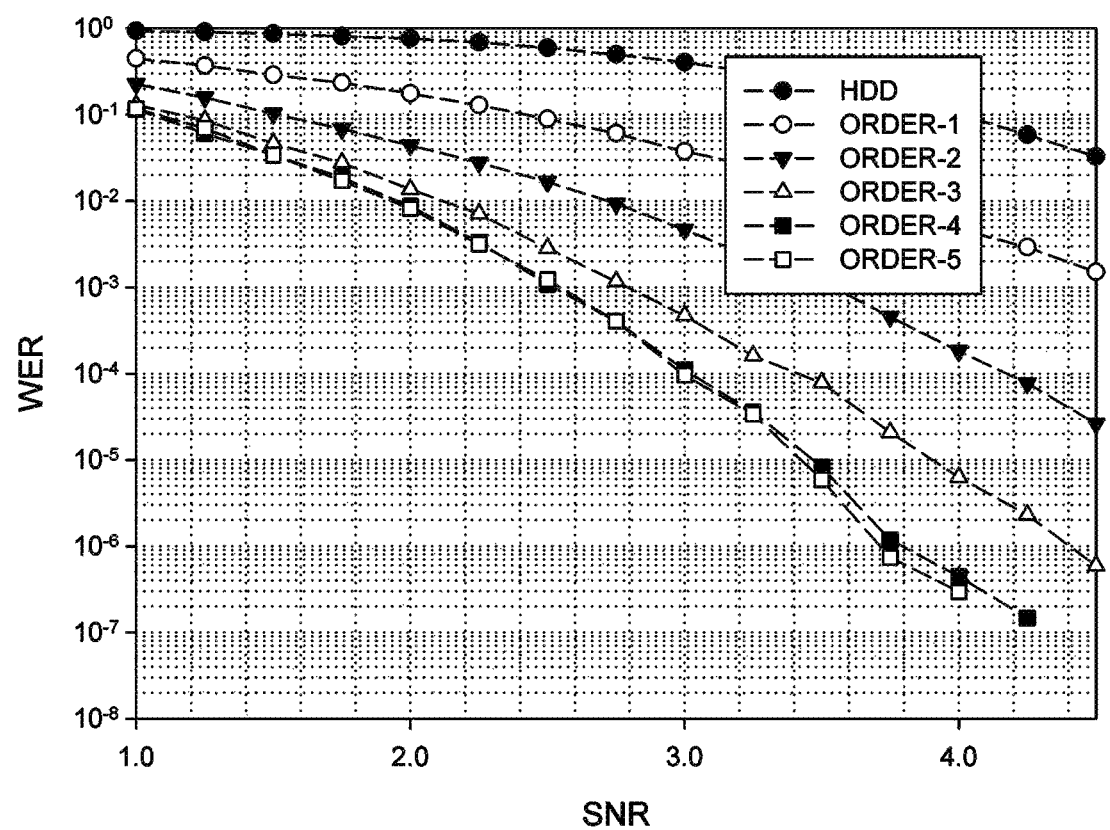
FIGS. 7A to 7D are graphs of analyzing decoding performance and speed according to Method 2 among the proposed methods according to exemplary embodiments of the present invention.
Figure 7B:
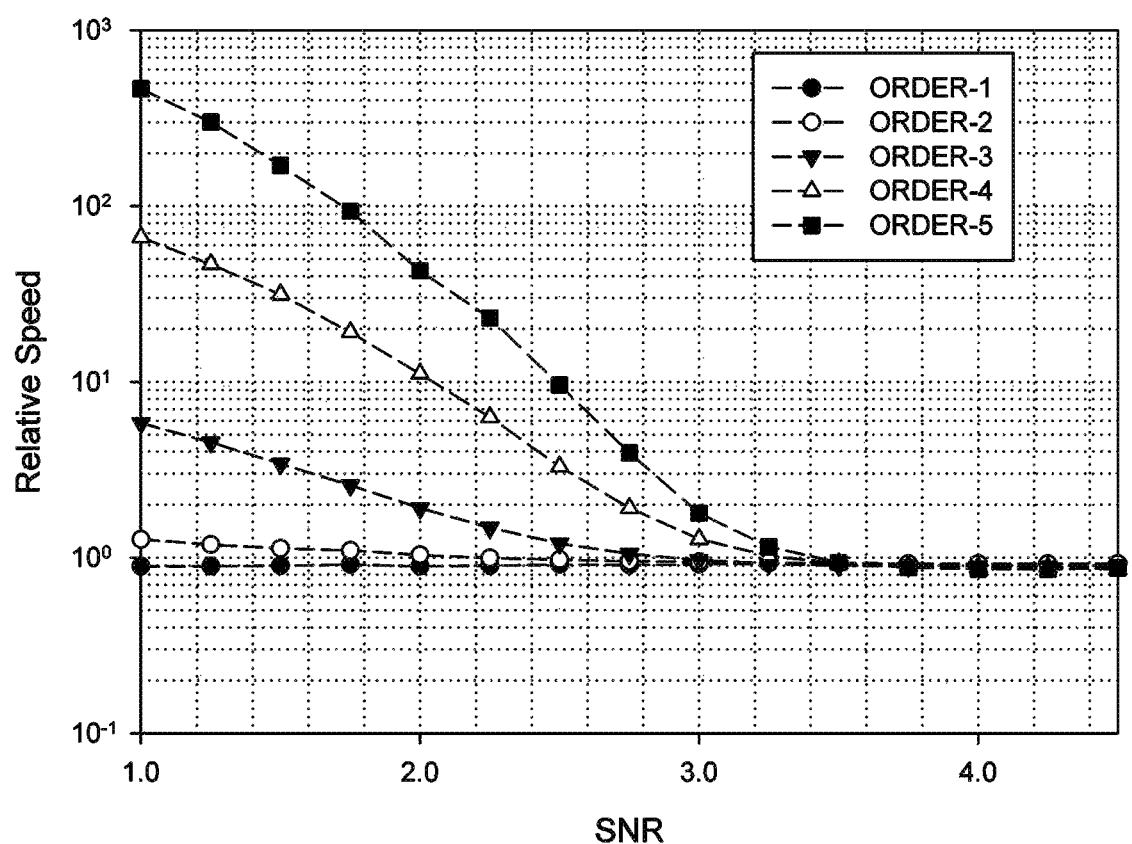

Experimental conditions in FIGS. 7A and 7B are the same as in FIGS. 6A to 6J.

Referring to FIGS. 7A and 7B, the decoding performance and speed of Method 2 according to each order may be confirmed. Here, a relative speed shown in FIG. 7B represents a relative speed compared to that of the OSD-full search (OSD-FS) in the order 1. Specifically, Method 2 converges to the speed of OSD-FS according to the order 1 as the SNR increases. That is, if the SNR is more than a certain degree, the higher the order, the better the decoding performance and the computational complexity can be minimized.

Figure 7C:
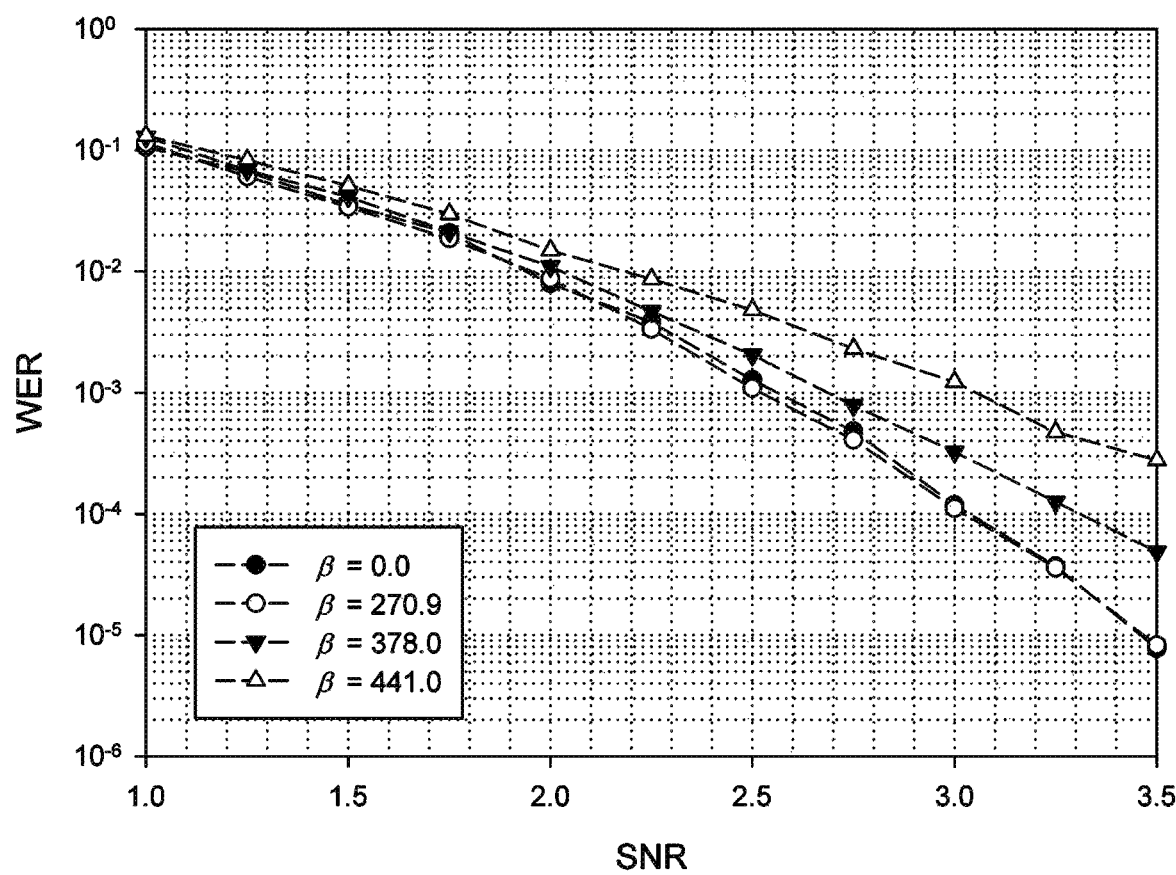
Figure 7D:
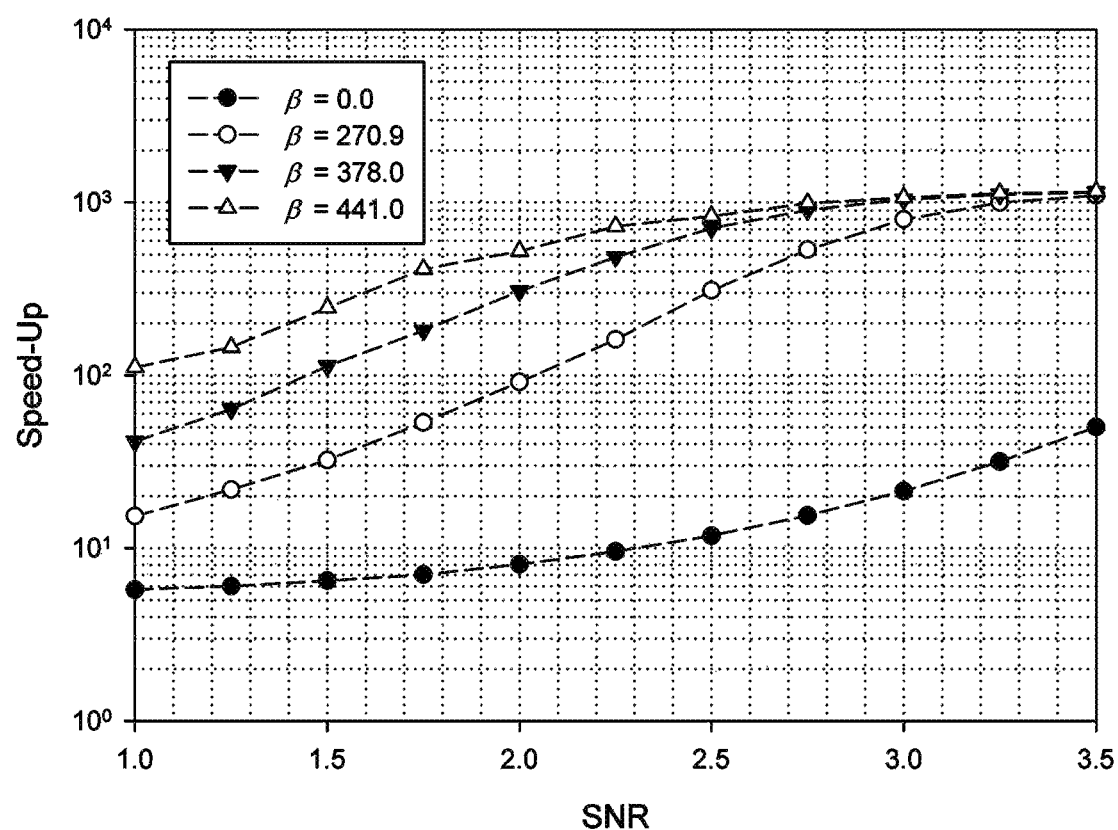
Figure 8A:
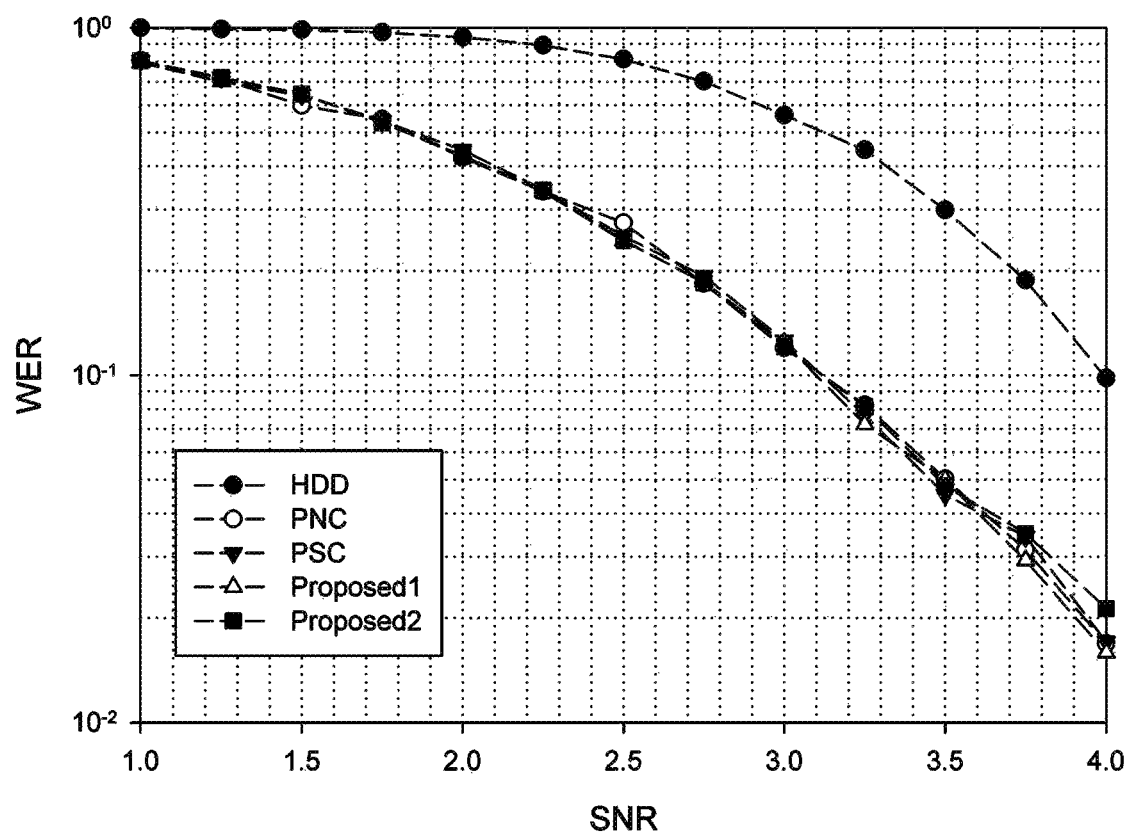
FIGS. 8A to 8H are graphs comparing decoding performances and speeds of the proposed methods according to embodiments of the present invention under different experimental conditions.
Figure 8B:
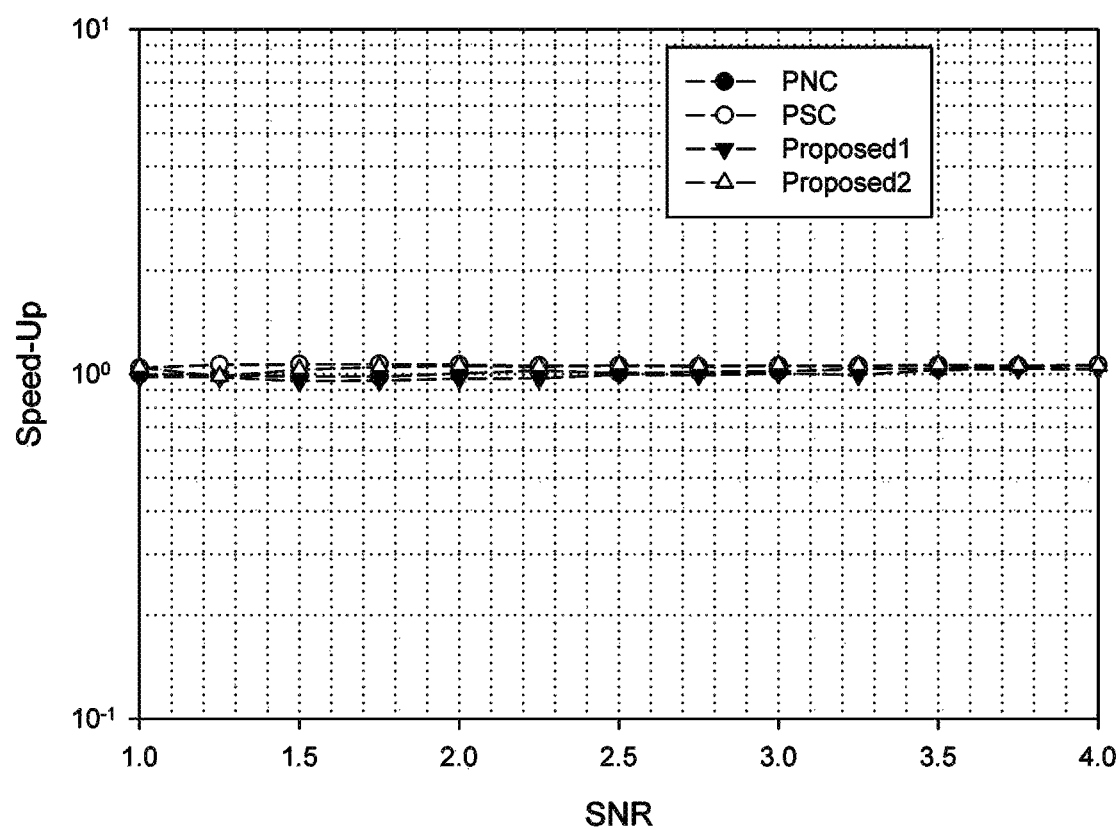
Figure 8C:
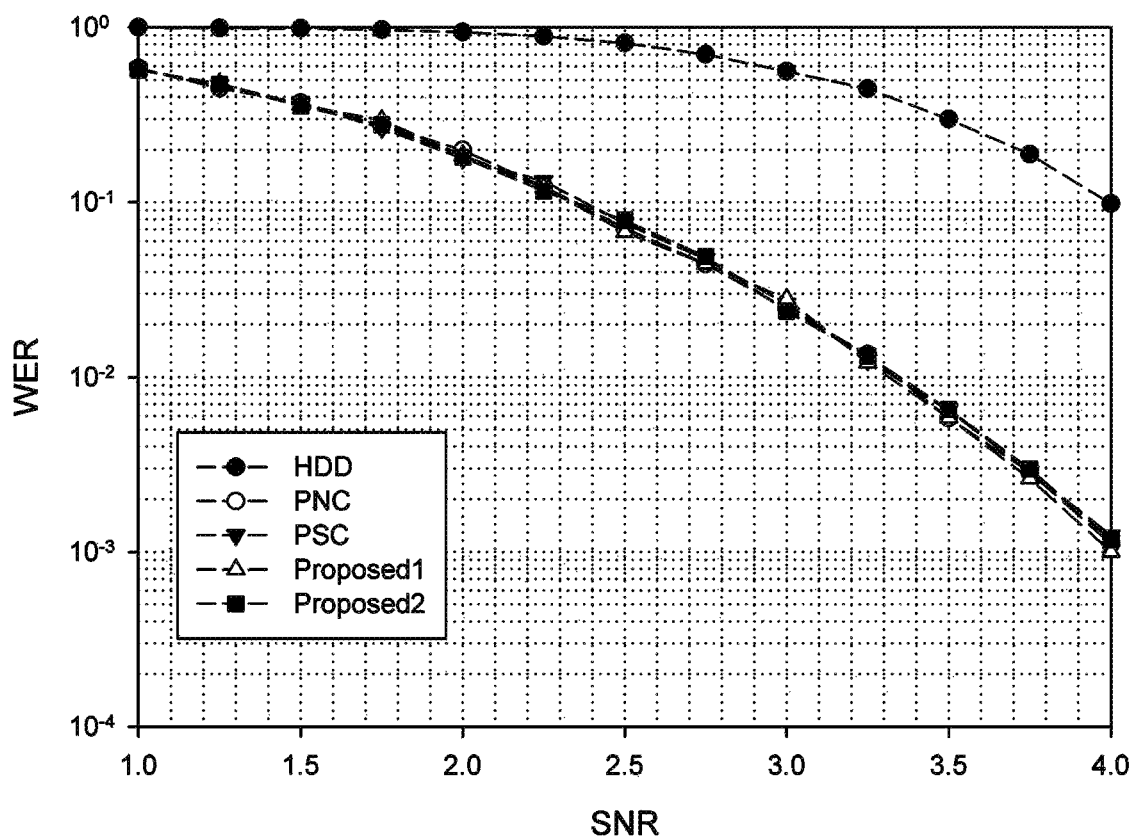
Figure 8D:
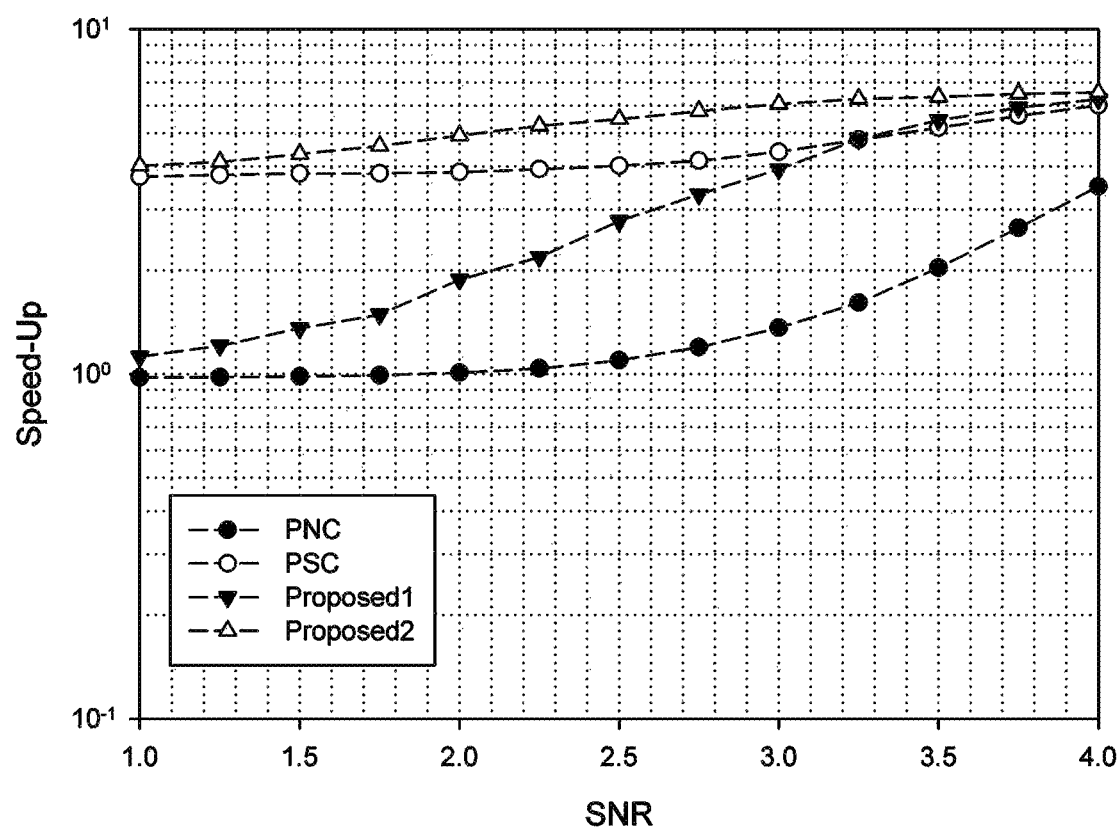
Figure 8E:
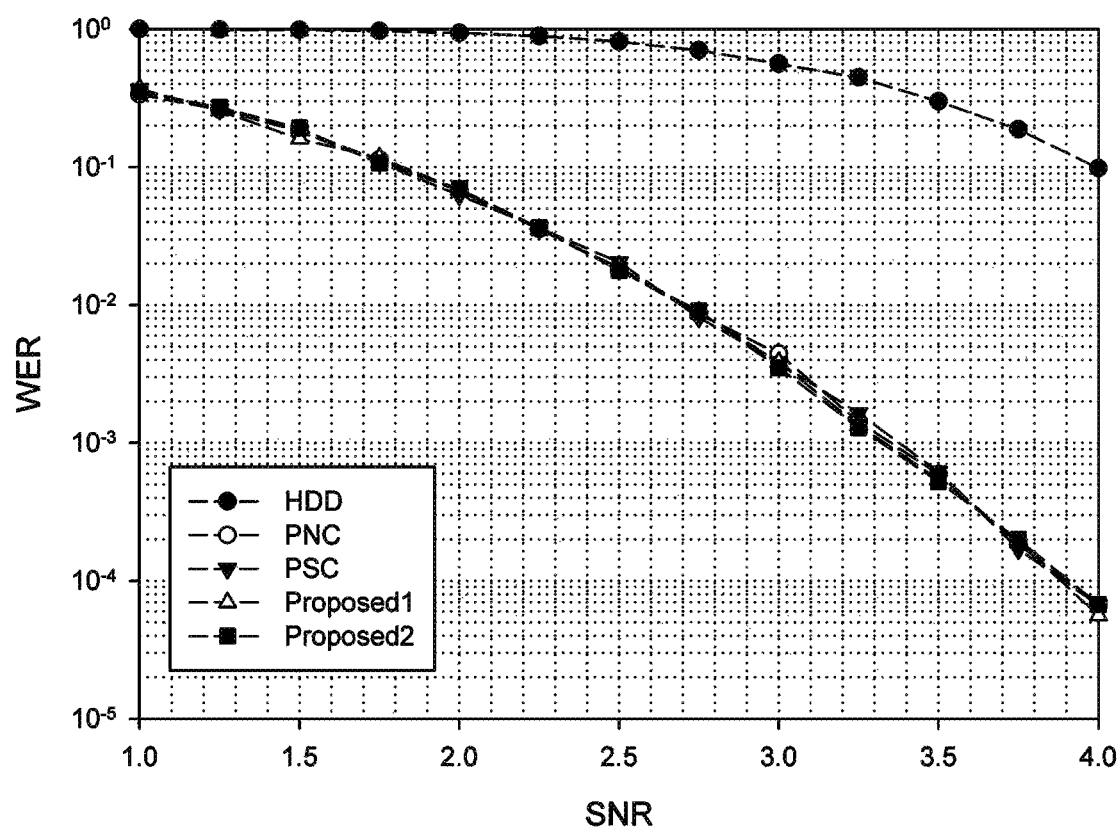
Figure 8F:
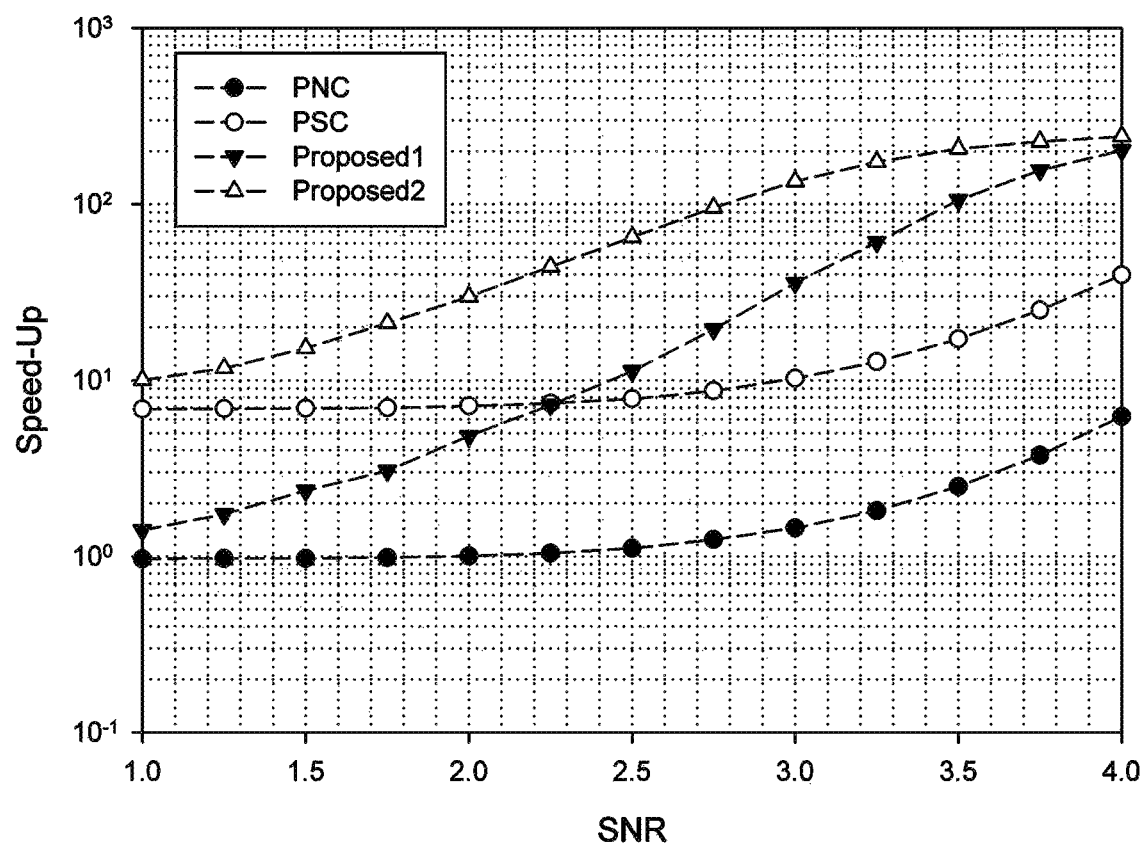
Figure 8G:
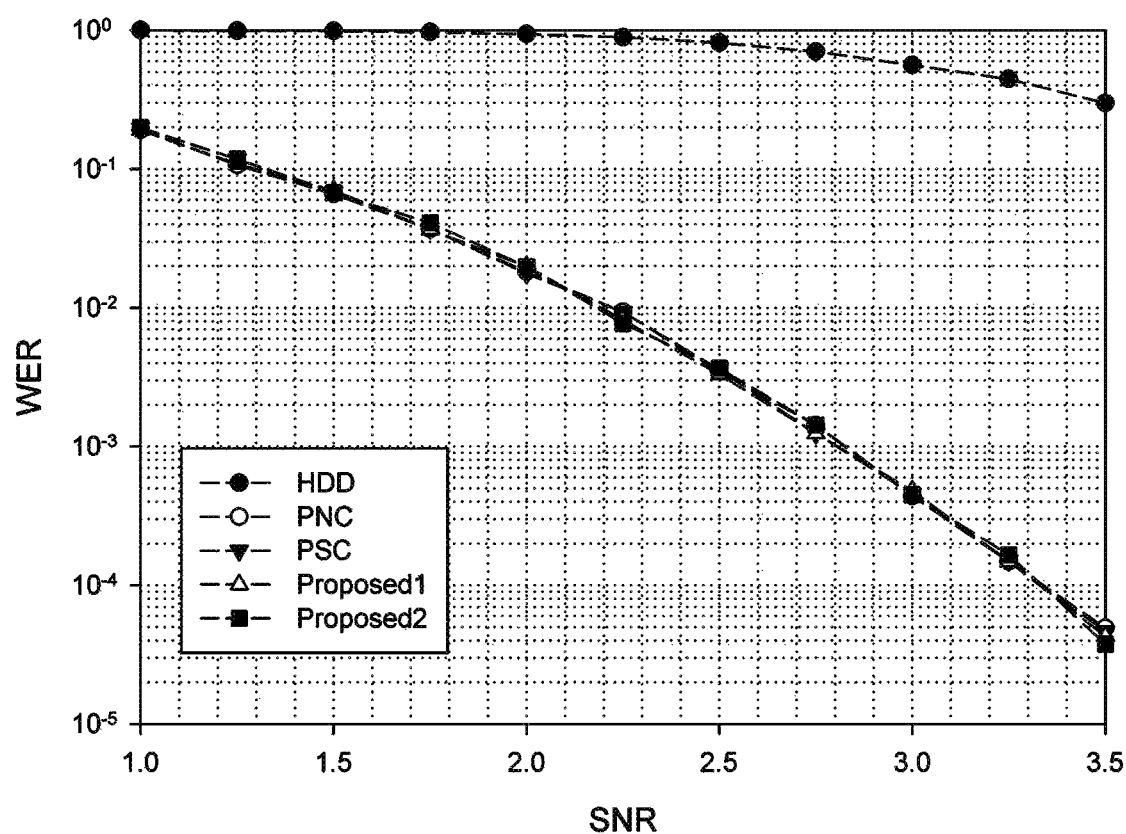
Figure 8H:
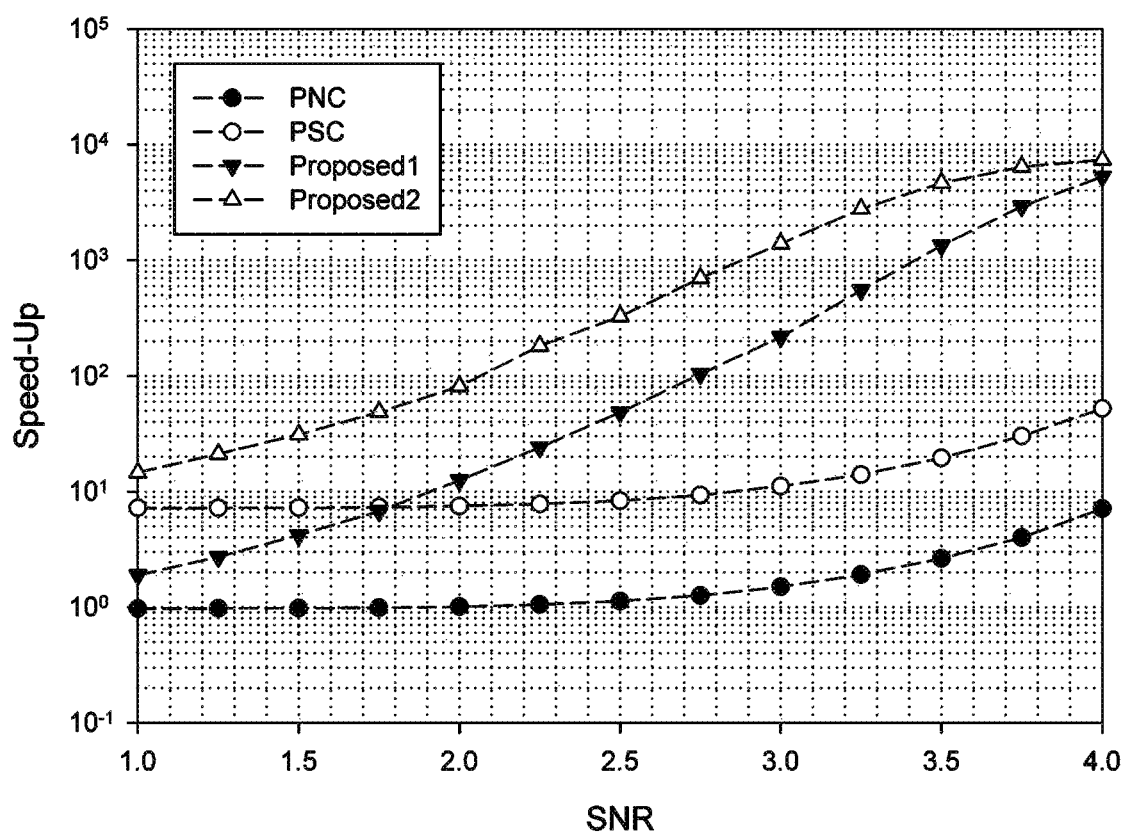

Referring to FIGS. 7C and 7D, the decoding performance and speed of Method 2 for the order 4 when the value (denoted as 'β' in the graph) of the function having the SNR, the order, and the error correction code as parameters is changed. In this case, the decoding speed shows a relative speed in the order 4 as compared with the OSD-FS. From the point of view of the decoding performance, the same performance is exhibited before β exceeds a specific value, and the decoding performance gradually decreases as β increases. The decoding speed shows a characteristic of getting faster as β increases. That is, a detailed trade-off relationship between the decoding performance and the decoding speed is established according to β, so that the user can change the parameters to suit the system environment.

FIGS. 8A to 8H are graphs comparing decoding performances and speeds of the proposed methods according to embodiments of the present invention under different experimental conditions.

In FIG. 8A to FIG. 8H, a BCH code having a length of 255, a dimension of 131, and a minimum distance of 37 is used. In addition, since the minimum distance of the HDD is 37, all of 18 or less errors are configured to be corrected. In this case, the decoding speed is a relative indication of how much faster the decoding speed is than the full search algorithm of the OSD (OSD-FS) described with reference to FIG. 2. In each experiment, all data were quantized to 7 bits, the first preconfigured threshold according to the PSC of FIG. 4 was set to 46, and the second preconfigured threshold according to the description of FIG. 5 was set to 18. In addition, in Method 1 (i.e., proposed 1) and Method 2 (i.e., proposed 2), 706.8, 706.8, 706.8, 706.8, 706.8, 644.8, and 620.0 were respectively configured for the orders 1 to 7 as the value of the function (f) having the SNR, the order, and the error correction code as the parameters.

Even when the order exceeds 5, the decoding performance of the codeword used in FIGS. 6A to 6J no longer improves. However, when increased to the order 7, the codeword used in FIGS. 8A to 8H is surely improved in the decoding performance. However, in the case of the PSC or the PNC, since enormous time is taken even at the order 5, the performances up to the order 4 are compared in FIGS. 8A to 8H.

Referring to FIGS. 8A to 8H, Method 1 and Method 2 show almost the same performance in the decoding performance as the PNC and the PSC. In contrast, the decoding speeds of Methods 1 to 2 are up to about 5287 times (Method 1) and 7420 times (Method 2) faster than the OSD-FS for each order, and up to about 747 times (Method 1) and 1775 times (Method 2) faster than the PNC. Also, they are about 101 times (Method 1) and 240 times (Method 2) faster than the PSC. Further, when the order is increased to 5 or more, Methods 1 and 2 can be predicted to be much faster than the PNC or the PSC.

FIGS. 9A to 9D are graphs analyzing decoding performance and speed according to Method 2 among the proposed methods according to exemplary embodiments of the present invention under different experimental conditions.

Experimental conditions in FIGS. 9A to 9D are the same as in FIGS. 8A to 8H.

Figure 9A:
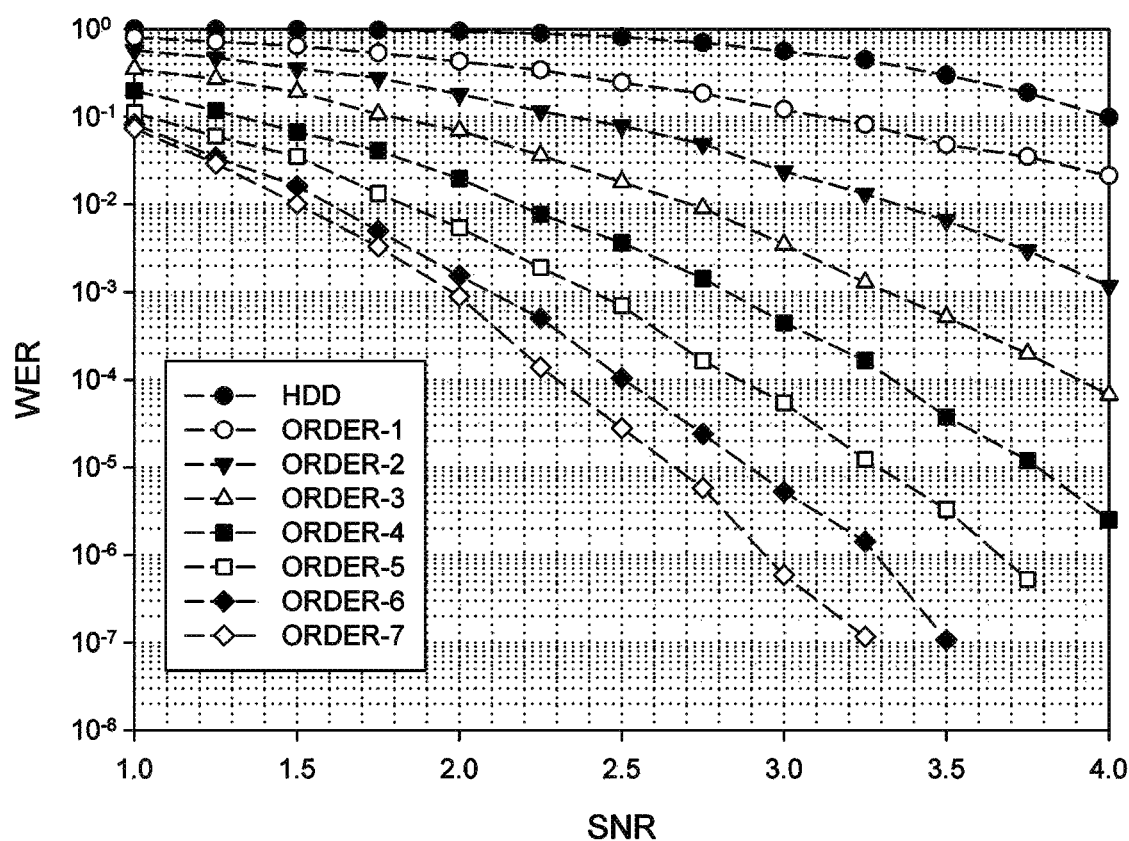
FIGS. 9A to 9D are graphs analyzing decoding performance and speed according to Method 2 among the proposed methods according to exemplary embodiments of the present invention under different experimental conditions.
Figure 9B:
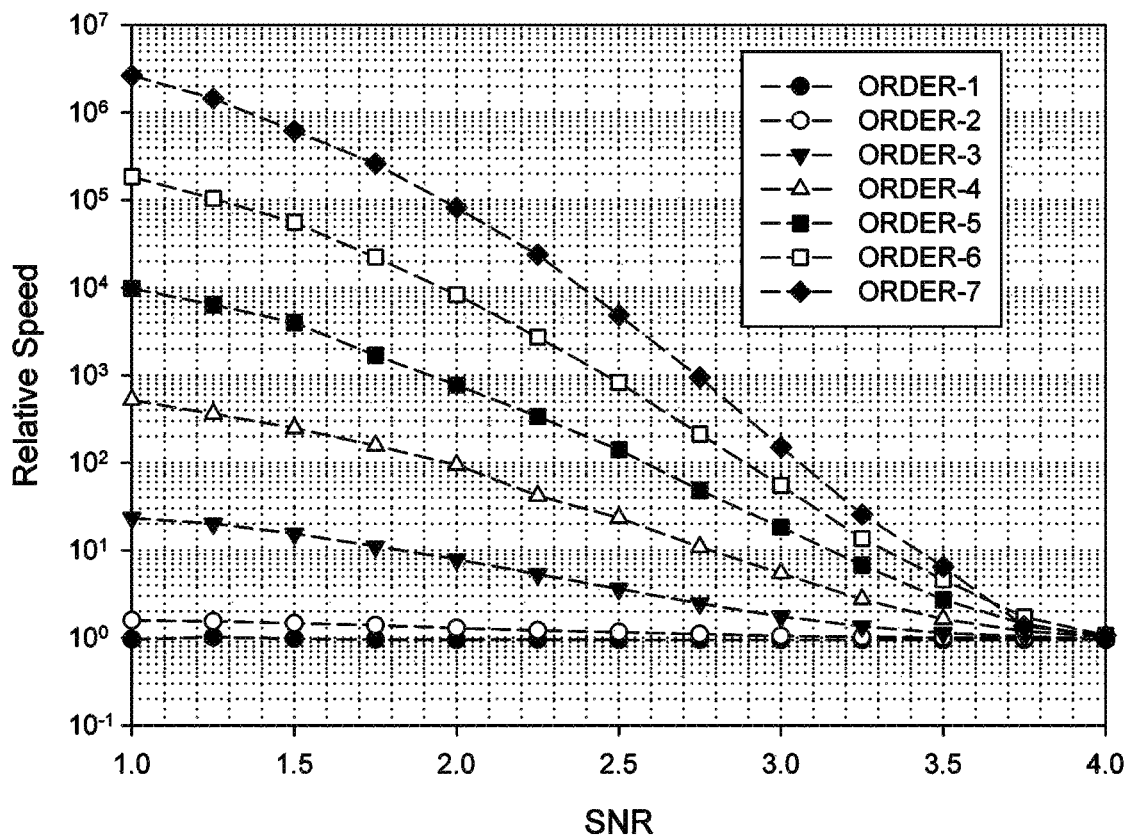

Referring to FIGS. 9A and 9B, the decoding performance and speed of Method 2 according to each order may be confirmed. Here, a relative speed shown in FIG. 9B represents a relative speed compared to that of the OSD-FD in the order of 1.

As can be seen from FIG. 9A, as the order increases, the decoding performance of Method 2 increases significantly. As in FIGS. 6A to 6J, as the SNR increases, Method 2 quickly converges to the speed of the OSD-FS for the order 1 regardless of the order. That is, if the SNR is above a certain level, the computational complexity is always maintained at a constant level (i.e., lowest level) regardless of the order.

Figure 9C:
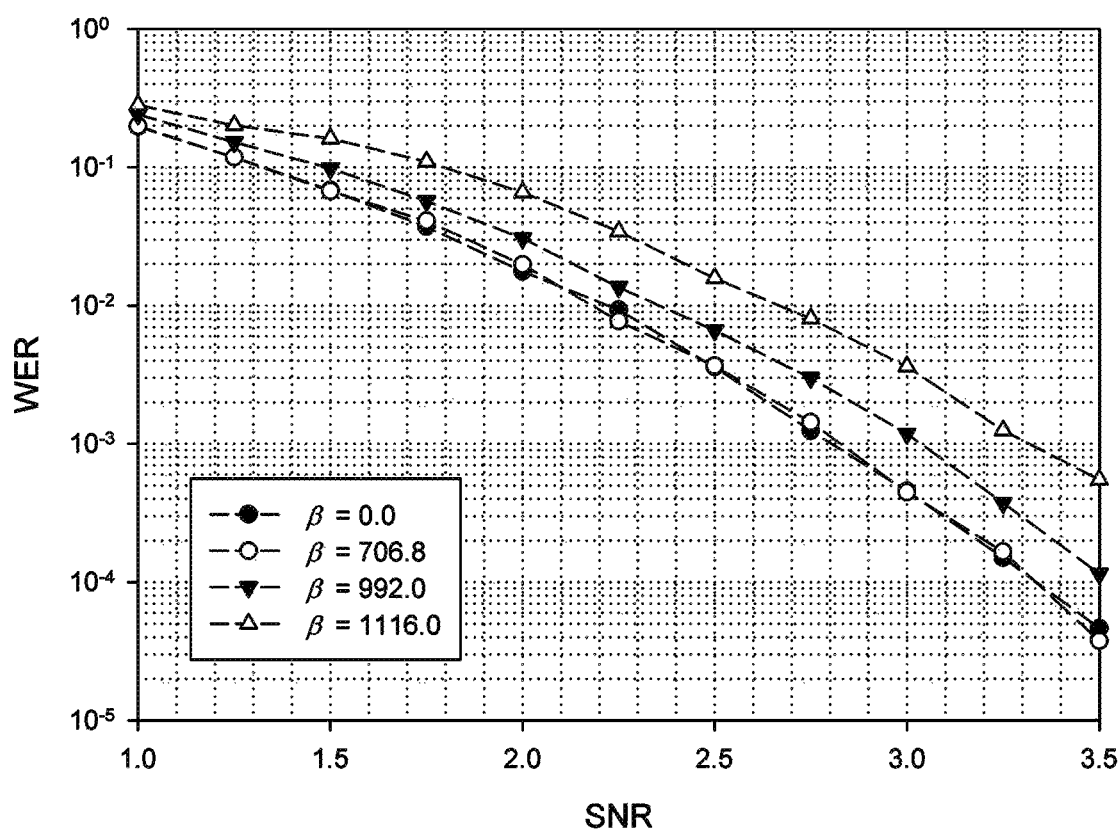
Figure 9D:
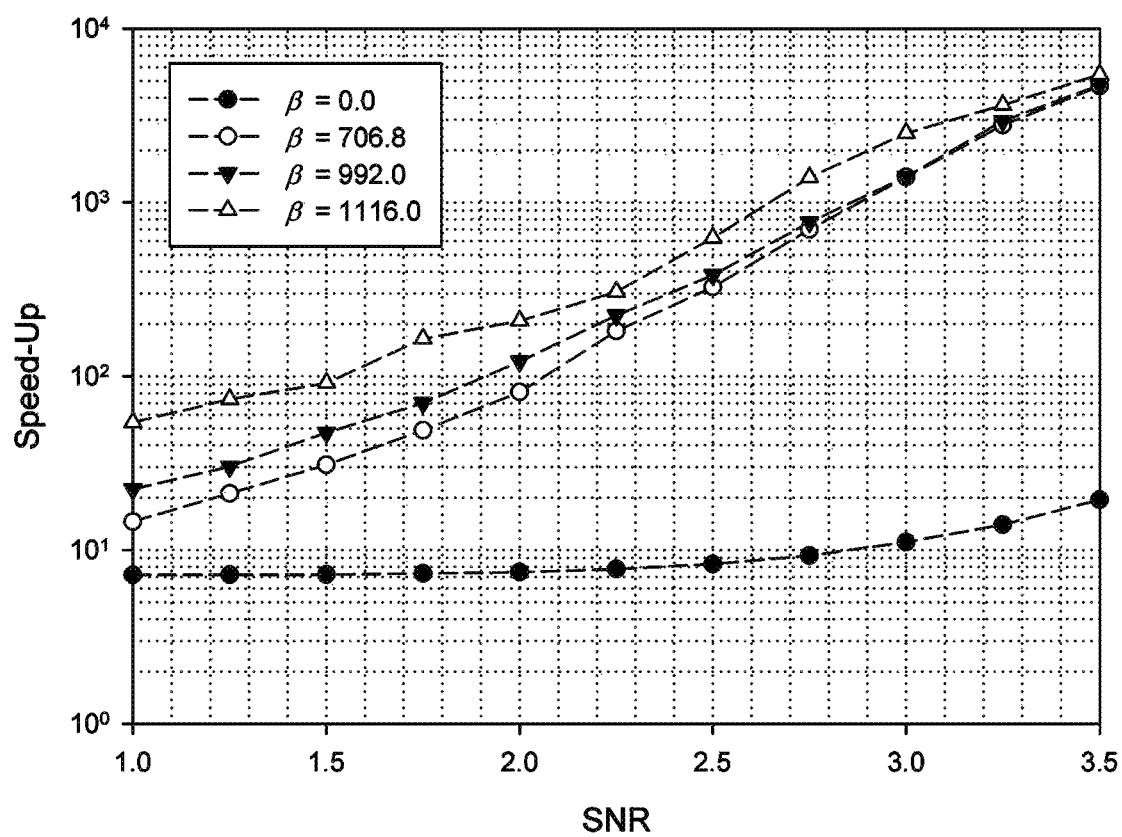

Referring to FIGS. 9C and 9D, the decoding performance and speed of Method 2 for the order 4 when the value (denoted as 'β' in the graph) of the function having the SNR, the order, and the error correction code as parameters is changed. In this case, the decoding speed shows a relative speed in the order 4 as compared with the OSD-FS. As in FIGS. 7A to 7D, the same performance is exhibited before β exceeds a specific value, and the decoding performance gradually decreases after exceeds the specific value as β increases. On the other hand, the decoding speed shows a characteristic of getting faster as β increases. Using this feature, the user can change the parameters to suit the system environment.

Figure 10:
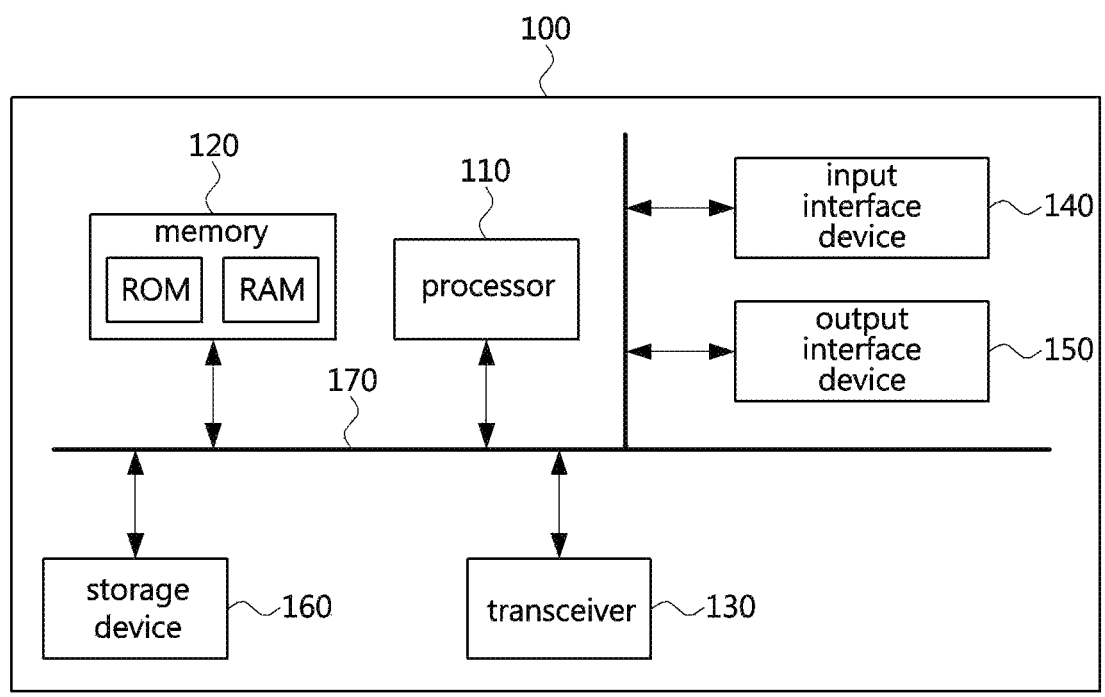
FIG. 10 is a hardware block diagram of an apparatus for fast decoding a linear code based on soft decision according to an exemplary embodiment of the present invention.

FIG. 10 is a hardware block diagram of an apparatus for fast decoding a linear code based on soft decision according to an exemplary embodiment of the present invention.

Referring to FIG. 10, an apparatus 100 for fast decoding a linear code based on soft decision may comprise at least one processor 110 and a memory 120 for storing instructions instructing the at least one processor 110 to perform at least one step.

In addition, the apparatus 100 may further comprise a transceiver 130 performing communications with a base station or a counterpart apparatus via a wired or wireless network. In addition, the apparatus 100 may further include an input interface device 140, an output interface device 150, a storage device 160, and the like. The components included in the apparatus 100 may be connected by a bus 170 to communicate with each other.

Here, the processor 110 may refer to a central processing unit (CPU), a graphics processing unit (GPU), or a dedicated processor on which the methods according to the exemplary embodiments of the present disclosure are performed. Each of the memory 120 and the storage device 160 may be configured as at least one of a volatile storage medium and a nonvolatile storage medium. For example, the memory 120 may be configured with at least one of a read only memory (ROM) and a random access memory (RAM).

The at least one step may comprise sorting received signals in a magnitude order to obtain sorted signals; obtaining hard decision signals by performing hard decision on the sorted signals; obtaining upper signals corresponding to most reliable bases (MRBs) from the hard decision signals; obtaining a permuted and corrected codeword candidate using the upper signals and an error vector according to a current order; calculating a cost for the current order using a cost function; determining the permuted and corrected codeword candidate as a permuted and corrected codeword according to a result of comparing the calculated cost with a minimum cost; and determining a predefined speeding condition.

The obtaining of the permuted and corrected codeword candidate may comprise obtaining the permuted and corrected codeword candidate by multiplying the upper signals and the error vector according to the current order with a permuted generator matrix.

The cost function may be defined as an operation of summing magnitudes of components of the sorted signals, which correspond to positions where the permuted corrected codeword candidate and the hard decision signals have different values.

The error vector may be defined as a vector having a same length as the MRBs and a hamming weight equal to the current order.

The determining of the predefined speeding condition may comprise calculating a speeding threshold by summing components having small magnitudes among components of the sorted signals corresponding to the MRBs; and comparing the calculated speeding threshold with the minimum cost.

The at least one step may comprise, after the comparing, obtaining the permuted and corrected codeword candidate for a next order of the current order in response to determining that the speeding threshold is smaller than the minimum cost as a result of the comparison.

The calculating of the speeding threshold may comprise calculating the speeding threshold by adding a sum of the components having small magnitudes to a function having a signal-to-noise ratio (SNR), an order, and an error correction code as parameters.

The at least one step may comprise, after the obtaining of the permuted and corrected codeword candidate, comparing a hamming distance between the hard decision signals and the permuted and corrected codeword candidate with a first preconfigured threshold.

The at least one step may comprise, after the comparing of the hamming distance and the first preconfigured threshold, in response to determining that the hamming distance is greater than the first preconfigured threshold as a result of the comparison, omitting operations on the error vector and obtaining the permuted and corrected codeword candidate by changing the error vector according to the current order.

The at least one step may comprise, after the obtaining of the permuted and corrected codeword candidate (or after the comparing the hamming distance with the first preconfigured threshold), comparing a hamming distance between the hard decision signals and the permuted and corrected codeword candidate with a second preconfigured threshold; and in response to determining that the hamming distance is less than the second preconfigured threshold, omitting the calculating of the cost, and immediately determining the permuted and corrected codeword candidate as the permuted and corrected codeword.

For example, the apparatus 100 for fast decoding a linear code based on soft decision may be a desktop computer, a laptop computer, a notebook, a smart phone, a tablet PC, a mobile phone, a smart watch, a smart glass, an e-book reader, a portable multimedia player (PMP), a portable game playing machine, a navigation device, a digital camera, a digital multimedia broadcasting (DMB) player, a digital audio recorder, a digital audio player, a digital video recorder, a digital video player, a personal digital assistant (PDA), or the like.

The exemplary embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the exemplary embodiments of the present disclosure, and vice versa.

In addition, the above-described method or apparatus may be implemented by combining all or part of the components or functions thereof, or may be implemented separately.

While the exemplary embodiments of the present disclosure and their advantages have been described in detail, it should be understood that various changes, substitutions and alterations may be made herein without departing from the scope of the present disclosure

The invention claimed is:

1. A method for fast decoding a linear code based on soft decision, the method comprising:
   sorting received signals in a magnitude order to obtain sorted signals;
   obtaining hard decision signals by performing hard decision on the sorted signals;
   obtaining upper signals corresponding to most reliable bases (MRBs) from the hard decision signals;
   obtaining a permuted and corrected codeword candidate using the upper signals and an error vector according to a current order;
   calculating a cost for the current order using a cost function;
   determining the permuted and corrected codeword candidate as a permuted and corrected codeword according to a result of comparing the calculated cost with a minimum cost; and
   determining a predefined speeding condition.

2. The method according to claim 1, wherein the obtaining of the permuted and corrected codeword candidate comprises obtaining the permuted and corrected codeword candidate by multiplying the upper signals and the error vector according to the current order with a permuted generator matrix.

3. The method according to claim 1, wherein the cost function is defined as an operation of summing magnitudes of components of the sorted signals, which correspond to positions where the permuted corrected codeword candidate and the hard decision signals have different values.

4. The method according to claim 1, wherein the error vector is defined as a vector having a same length as the MRBs and a hamming weight equal to the current order.

5. The method according to claim 1, wherein the determining of the predefined speeding condition comprises:
calculating a speeding threshold by summing components having small magnitudes among components of the sorted signals corresponding to the MRBs; and
comparing the calculated speeding threshold with the minimum cost.

6. The method according to claim 5, further comprising, after the comparing, obtaining the permuted and corrected codeword candidate for a next order of the current order in response to determining that the speeding threshold is smaller than the minimum cost as a result of the comparison.

7. The method according to claim 5, wherein the calculating of the speeding threshold comprises calculating the speeding threshold by adding a sum of the components having small magnitudes to a function having a signal-to-noise ratio (SNR), an order, and an error correction code as parameters.

8. The method according to claim 1, further comprising, after the obtaining of the permuted and corrected codeword candidate, comparing a hamming distance between the hard decision signals and the permuted and corrected codeword candidate with a first preconfigured threshold.

9. The method according to claim 8, further comprising, after the comparing the hamming distance with the first preconfigured threshold, in response to determining that the hamming distance is greater than the first preconfigured threshold as a result of the comparison, omitting operations on the error vector and obtaining the permuted and corrected codeword candidate by changing the error vector according to the current order.

10. The method according to claim 1, further comprising, after the obtaining of the permuted and corrected codeword candidate,
comparing a hamming distance between the hard decision signals and the permuted and corrected codeword candidate with a second preconfigured threshold; and
in response to determining that the hamming distance is less than the second preconfigured threshold, omitting the calculating of the cost, and immediately determining the permuted and corrected codeword candidate as the permuted and corrected codeword.

11. An apparatus for decoding a linear code based on soft decision at a high speed, the apparatus comprising:
at least one processor; and
a memory storing instructions causing the at least one processor to perform at least one step,
wherein the at least one step comprises:
sorting received signals in a magnitude order to obtain sorted signals;
obtaining hard decision signals by performing hard decision on the sorted signals;
obtaining upper signals corresponding to most reliable bases (MRBs) from the hard decision signals;
obtaining a permuted and corrected codeword candidate using the upper signals and an error vector according to a current order;
calculating a cost for the current order using a cost function;
determining the permuted and corrected codeword candidate as a permuted and corrected codeword according to a result of comparing the calculated cost with a minimum cost; and
determining a predefined speeding condition.

12. The apparatus according to claim 11, wherein the obtaining of the permuted and corrected codeword candidate comprises obtaining the permuted and corrected codeword candidate by multiplying the upper signals and the error vector according to the current order with a permuted generator matrix.

13. The apparatus according to claim 11, wherein the cost function is defined as an operation of summing magnitudes of components of the sorted signals, which correspond to positions where the permuted corrected codeword candidate and the hard decision signals have different values.

14. The apparatus according to claim 11, wherein the error vector is defined as a vector having a same length as the MRBs and a hamming weight equal to the current order.

15. The apparatus according to claim 11, wherein the determining of the predefined speeding condition comprises:
calculating a speeding threshold by summing components having small magnitudes among components of the sorted signals corresponding to the MRBs; and
comparing the calculated speeding threshold with the minimum cost.

16. The apparatus according to claim 15, further comprising, after the comparing, obtaining the permuted and corrected codeword candidate for a next order of the current order in response to determining that the speeding threshold is smaller than the minimum cost as a result of the comparison.

17. The apparatus according to claim 15, wherein the calculating of the speeding threshold comprises calculating the speeding threshold by adding a sum of the components having small magnitudes to a function having a signal-to-noise ratio (SNR), an order, and an error correction code as parameters.

18. The apparatus according to claim 17, further comprising, after the obtaining of the permuted and corrected codeword candidate, comparing a hamming distance between the hard decision signals and the permuted and corrected codeword candidate with a first preconfigured threshold.

19. The apparatus according to claim 18, further comprising, after the comparing the hamming distance with the first preconfigured threshold, in response to determining that the hamming distance is greater than the first preconfigured threshold as a result of the comparison, omitting operations on the error vector and obtaining the permuted and corrected codeword candidate by changing the error vector according to the current order.

20. The apparatus according to claim 18, further comprising, after the obtaining of the permuted and corrected codeword candidate,
comparing a hamming distance between the hard decision signals and the permuted and corrected codeword candidate with a second preconfigured threshold; and
in response to determining that the hamming distance is less than the second preconfigured threshold, omitting the calculating of the cost, and immediately determining the permuted and corrected codeword candidate as the permuted and corrected codeword.

* * * * *